(12) United States Patent
Kim et al.

(10) Patent No.: US 10,483,317 B2
(45) Date of Patent: Nov. 19, 2019

(54) IMAGE SENSOR AND METHOD OF MANUFACTURING THE SAME

(71) Applicant: Samsung Electronics Co., Ltd., Suwon-si, Gyeonggi-do (KR)

(72) Inventors: Sun-hyun Kim, Anyang-si (KR); Han-seok Kim, Seoul (KR); Chung-ho Song, Uiwang-si (KR); Jin-ju Jeon, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 2 days.

(21) Appl. No.: 15/835,626

(22) Filed: Dec. 8, 2017

(65) Prior Publication Data
US 2018/0182808 A1    Jun. 28, 2018

(30) Foreign Application Priority Data

Dec. 23, 2016  (KR) .................. 10-2016-0177949

(51) Int. Cl.
*H01L 27/146* (2006.01)
*H01L 23/544* (2006.01)

(52) U.S. Cl.
CPC ...... *H01L 27/14689* (2013.01); *H01L 23/544* (2013.01); *H01L 27/14621* (2013.01); *H01L 27/14627* (2013.01); *H01L 27/14632* (2013.01); *H01L 27/14636* (2013.01); *H01L 27/14687* (2013.01)

(58) Field of Classification Search
CPC ................ H01L 23/562; H01L 23/585; H01L 27/14609; H01L 27/14643

USPC ........ 257/620, E27.133, 233, 292, 431–466, 257/81, 82, 116, 117, 749; 438/48, 54, 438/69, 70, 462, 51, 55, 64–68, 83, 98
See application file for complete search history.

(56) References Cited

U.S. PATENT DOCUMENTS

| | | |
|---|---|---|
| 8,076,756 B2 | 12/2011 | Lane et al. |
| 8,130,253 B2 | 3/2012 | Ohkawa et al. |
| 8,642,447 B2 | 2/2014 | Itou et al. |
| 8,786,055 B2 | 7/2014 | Kawashima |
| 8,970,008 B2 | 3/2015 | Gratz et al. |

(Continued)

FOREIGN PATENT DOCUMENTS

| | | |
|---|---|---|
| JP | 2016/027664 A | 2/2016 |
| KR | 2002/0026995 A | 4/2002 |

*Primary Examiner* — Jonathan Han
(74) *Attorney, Agent, or Firm* — Harness, Dickey & Pierce, P.L.C.

(57) ABSTRACT

The present disclosure provides an image sensor and a method of manufacturing the same. An image sensor includes a first substrate, a barrier structure, a first structure, a second substrate, and a second structure. The first substrate includes a device region in which unit pixels are disposed and a first residual scribe lane region surrounding the device region. The first substrate has a first surface and a second surface. The barrier structure penetrates the first substrate in the first residual scribe lane region. The first surface of the first substrate is on the first structure. The second substrate includes a second residual scribe lane region facing the first residual scribe lane region. The second substrate has a front surface and a rear surface. The second structure is on the front surface of the second substrate and faces the first surface of the first substrate. The second structure is bonded to the first structure.

20 Claims, 25 Drawing Sheets

(56) References Cited

U.S. PATENT DOCUMENTS

| | | | |
|---|---|---|---|
| 2009/0140365 A1* | 6/2009 | Lee | H01L 27/14603 257/460 |
| 2009/0200625 A1* | 8/2009 | Venezia | H01L 27/1463 257/432 |
| 2010/0140747 A1 | 6/2010 | Choi et al. | |
| 2012/0211849 A1* | 8/2012 | Matsugai | H01L 27/1464 257/432 |
| 2013/0134542 A1* | 5/2013 | Lu | H01L 27/14618 257/437 |
| 2016/0020235 A1* | 1/2016 | Yamashita | H01L 27/14609 250/208.1 |
| 2016/0104682 A1 | 4/2016 | Winter | |
| 2016/0172405 A1* | 6/2016 | Hori | H01L 27/14636 257/432 |
| 2016/0181208 A1 | 6/2016 | Bao et al. | |
| 2016/0204074 A1 | 7/2016 | Lin et al. | |

\* cited by examiner

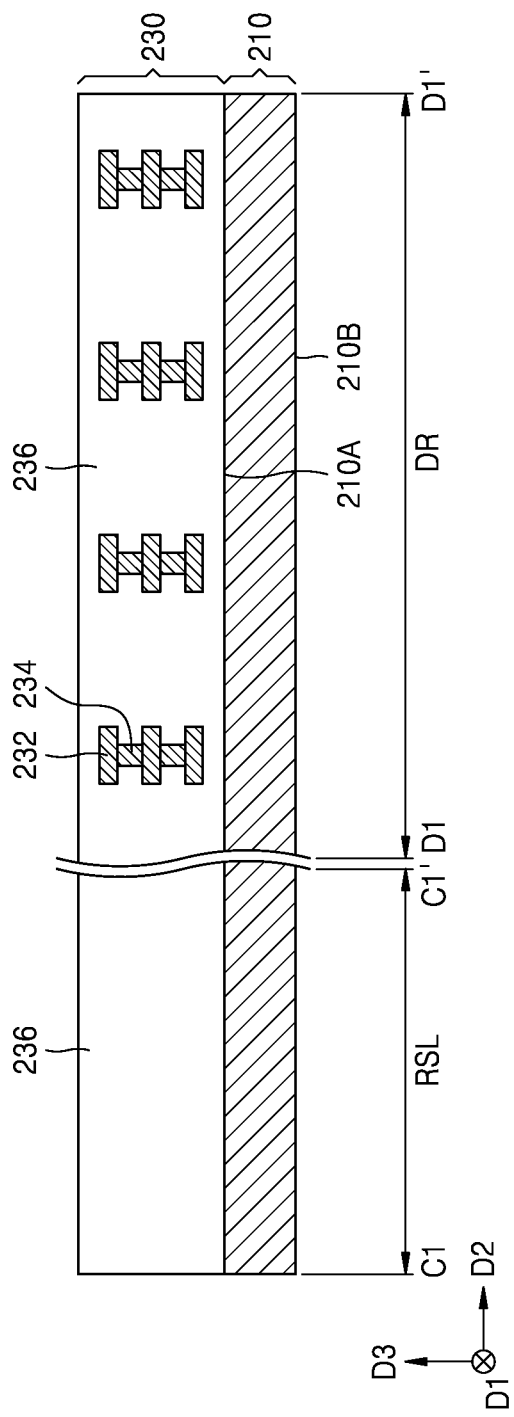

IMAGE SENSOR AND METHOD OF MANUFACTURING THE SAME

CROSS-REFERENCE TO RELATED APPLICATION

This application claims the benefit of Korean Patent Application No. 10-2016-0177949, filed on Dec. 23, 2016, in the Korean Intellectual Property Office, the disclosure of which is incorporated herein in its entirety by reference.

BACKGROUND

Inventive concepts relate to an image sensor and a method of manufacturing the same, and more particularly, to an image sensor including a residual scribe lane region and a method of manufacturing the same.

In general, an image sensor may be manufactured through a die sawing process of cutting a substrate on which pixels are formed. During the die sawing process, a sawing blade cuts the substrate along scribe lane regions to physically separate a plurality of image sensors from one another. In order to increase the number of image sensors per substrate, an area occupied in the substrate by the scribe lane regions has been gradually reduced.

SUMMARY

Inventive concepts provide an image sensor capable of reducing a risk of damaging pixels due to a stress applied to a substrate during a die sawing process.

Inventive concepts also provide a method of manufacturing an image sensor capable of reducing a risk of damaging pixels due to a stress applied to a substrate during a die sawing process.

According to some example embodiments of inventive concepts, an image sensor includes a first substrate, a barrier structure, a first structure, a second substrate, and a second structure. The first substrate includes a device region in which a plurality of unit pixels are disposed, and a first residual scribe lane region surrounding the device region. The first substrate has a first surface and a second surface opposite the first surface. The barrier structure penetrates the first substrate in the first residual scribe lane region. The first surface of the first substrate is on the first structure. The first substrate includes a first conductive film and a first insulating film. The second substrate includes a second residual scribe lane region facing the first residual scribe lane region. The second substrate has a front surface and a rear surface opposite the front surface. The second structure is on the front surface of the second substrate and faces the first surface of the first substrate. The second structure is bonded to the first structure. The second structure includes a second conductive film and a second insulating film.

According to some example embodiments of inventive concepts, a method of manufacturing an image sensor includes forming a plurality of trenches in a first surface of a first substrate, filling the plurality of trenches to simultaneously form insulating structures in a device region and a first residual scribe lane region of the first substrate, forming a first structure on the first surface of the first substrate, grinding a second surface of the first substrate to expose the insulating structures, forming a second structure on a front surface of a second substrate, and bonding the first structure and the second structure. The forming the plurality of trenches includes forming the plurality of trenches in the device region and the first residual scribe lane region, respectively, of the first substrate. The first substrate includes a plurality of pixels in the device region. The second surface of the first substrate is opposite the first surface. The first residual scribe region surrounds the device region. The first structure includes a first conductive film and a first insulating film. The second substrate includes a rear surface opposite the front surface. The second structure includes a second conductive film and a second insulating film.

According to some example embodiments, an image sensor includes a first structure on a second structure, and a first substrate on the first structure. The first structure includes a first conductive film and a first insulating film. The second structure includes a second conductive film and a second insulating film. The first substrate includes a first surface opposite a second surface. The first substrate includes a first residual scribe lane region surrounding a device region. The device region includes a plurality of unit pixels. The first substrate includes a barrier structure penetrating the first residual scribe lane region of the first substrate.

BRIEF DESCRIPTION OF THE DRAWINGS

Inventive concepts will be more clearly understood from the following detailed description of non-limiting embodiments, taken in conjunction with the accompanying drawings, in which:

FIGS. 6A to 6F are cross-sectional views for describing a method of manufacturing an image sensor, according to some example embodiments;

DETAILED DESCRIPTION

Hereinafter, inventive concepts will be described with reference to the accompanying drawings.

Figure 1:
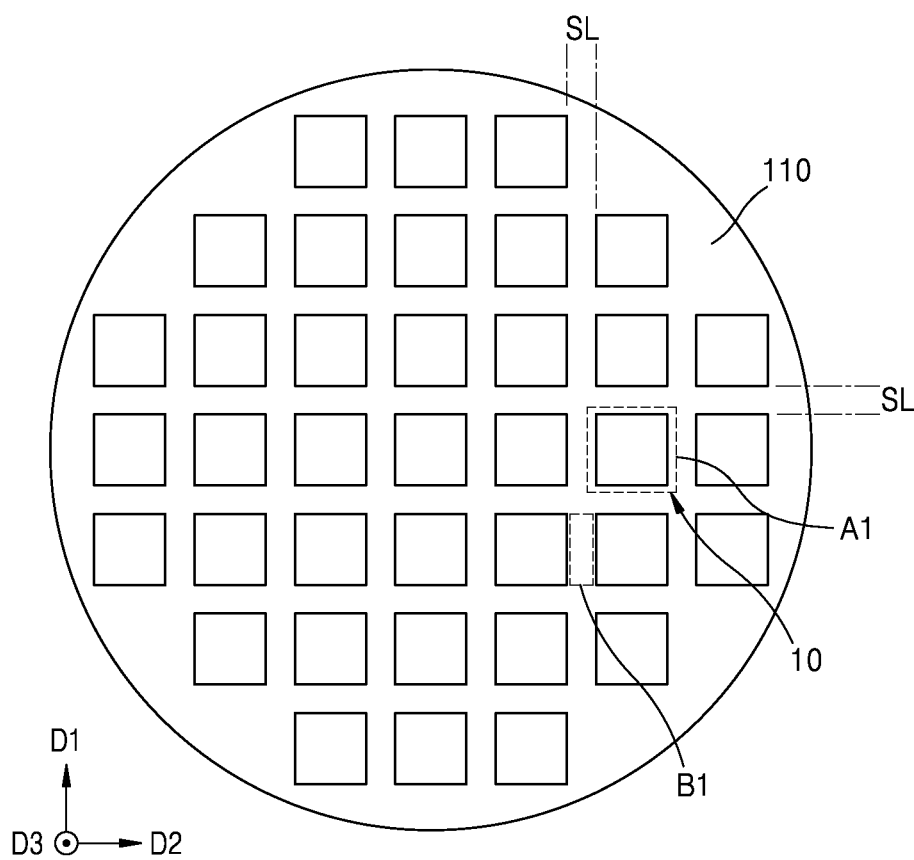
FIG. 1 is a plan view of a substrate including image sensors, according to some example embodiments.

FIG. 1 is a plan view of a substrate 110 including a plurality of image sensors 10, according to some example embodiments.

Referring to FIG. 1, the substrate 110 includes a plurality of image sensors 10 and a scribe lane region SL defined between the image sensors 10.

The substrate 110 may be a semiconductor substrate and may refer to a wafer. The substrate 110 may include a semiconductor material, for example, silicon (Si). Alternatively, the substrate 110 may include an element semiconductor material such as germanium (Ge) or a compound semiconductor material such as SiC, GaAs, InAs, and InP. In some example embodiments, the substrate 110 may have a semiconductor on insulator structure, such as a silicon on insulator (SOI) structure. The substrate 110 may be a substrate in which a first substrate and a second substrate are bonded to each other by a bonding member.

The image sensors 10 may be two-dimensionally disposed above the substrate 110. The image sensor 10 may include a plurality of unit pixels, a plurality of transistors, and a plurality of logic devices. The image sensor 10 may refer to an image sensor chip.

The scribe lane region SL may extend in a first direction D1 and a second direction D2 perpendicular to the first direction D1. The scribe lane region SL may have a straight lane shape having a constant width. That is, the image sensors 10 may be surrounded by the scribed lane region SL and spaced apart from one another. The image sensors 10 may be separated into image sensor chips by performing a die sawing process thereon along the scribe lane region SL.

The scribe lane region SL may be divided into a first region surrounding edges of the image sensors 10 in portions adjacent to the image sensors 10, and a second region surrounding the first region. That is, the second region may be spaced apart from the image sensor 10, with the first region disposed therebetween. The first region may be a region through which a sawing blade does not pass during a die sawing process and may be a region for securing a margin of the die sawing process. The second region may be a region that is cut while a sawing blade passes therethrough during a die sawing process. For example, the sawing blade may separate the image sensors 10 from one another along the second region. In the image sensor 10, the first region may be included as a residual scribe lane region RSL (see FIG. 2).

As the substrate 110 and various types of material films formed on the substrate 110 are cut by the die sawing process, the substrate 110 may be physically separated into the image sensors 10.

In order to increase the number of image sensor chips per substrate, an area occupied in the substrate 110 by the scribe lane region SL has recently been gradually reduced. Thus, a stress applied to the substrate 110 during the die sawing process increases a risk of damaging pixels of the image sensor 10.

Therefore, an aspect of inventive concepts provides the image sensor 10 in which a barrier structure is formed to block a progress of crack generated during the die sawing process of cutting the substrate 110, without additional processes, thereby limiting and/or preventing a defect of pixels due to the crack generated in the scribe lane region SL. Consequently, it is possible to improve the reliability of the image sensor 10 and the productivity of the process of manufacturing the image sensor 10.

Figure 2:
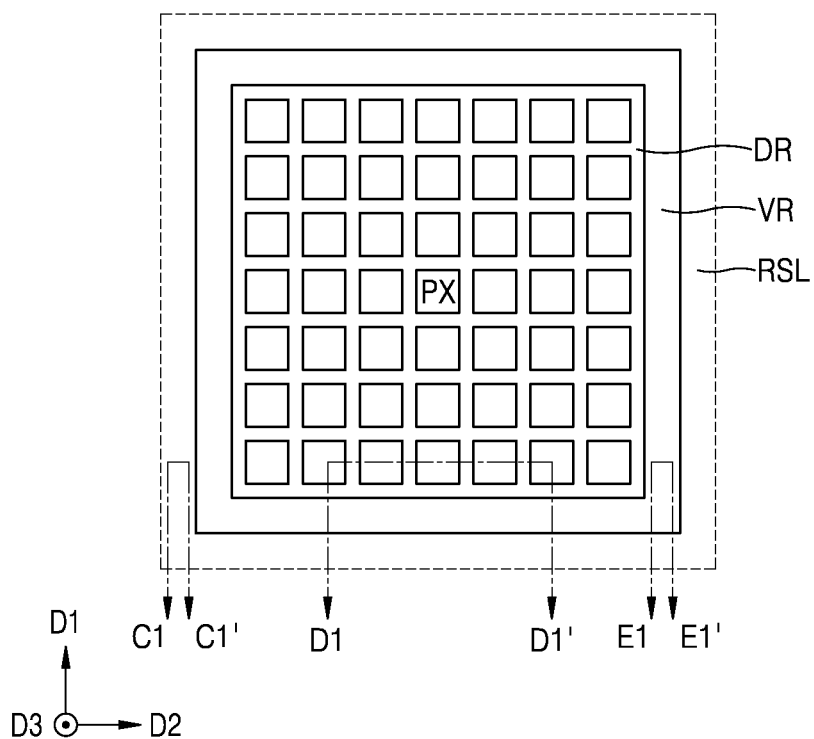
FIG. 2 is a plan view of an image sensor according to some example embodiments.

FIG. 2 is a plan view of an image sensor according to some example embodiments. Specifically, FIG. 2 is an enlarged plan view of the image sensor 10 in a portion A1 of FIG. 1.

Referring to FIG. 2, the image sensor 10 may include a device region DR in which a plurality of unit pixels PX are disposed, a via region VR in which a plurality of via structures are disposed and which surrounds the device region DR, and a residual scribe lane region RSL in which a barrier structure is disposed and which surrounds the via region VR. The via region VR is illustrated as surrounding the device region DR, but a layout of the image sensor 10 illustrated in FIG. 2 is merely an example and may be variously modified within the scope of inventive concepts.

In the device region DR, the unit pixel PX of the image sensor 10 may include a photodiode, a transfer transistor configured to transfer charges generated by the photodiode, a floating diffusion region configured to store the charges transferred by the transfer transistor, a reset transistor configured to periodically reset the floating diffusion region, a source follower transistor configured to amplify the charges stored in the floating diffusion region, and a select transistor configured to output an output signal of the source follower transistor in response to a unit pixel select signal. However, the configuration of the unit pixel PX is not limited thereto.

Figure 3:
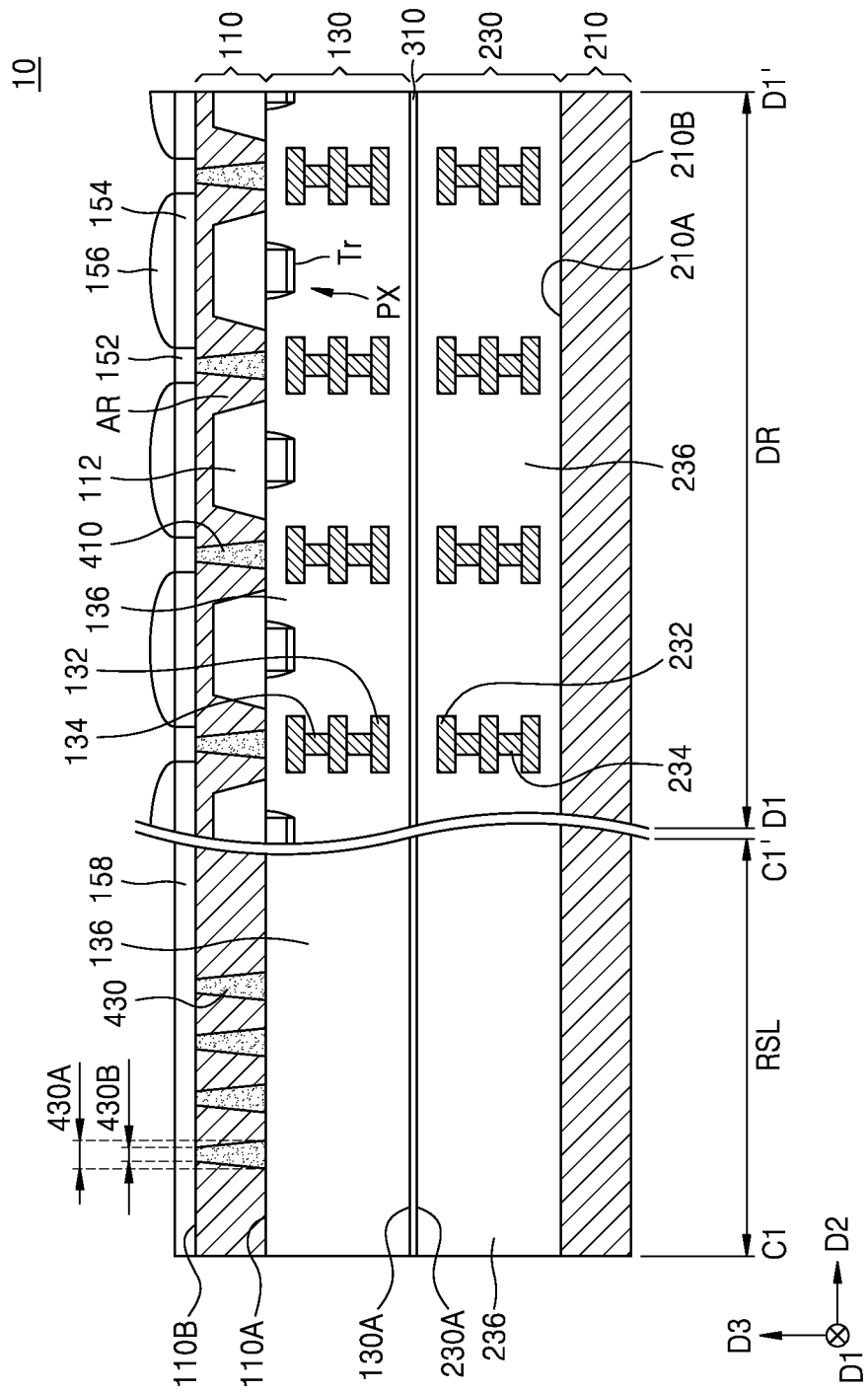
FIG. 3 is a cross-sectional view of a residual scribe lane region and a device region of an image sensor, according to some example embodiments.

FIG. 3 is a cross-sectional view of a residual scribe lane region and a device region of an image sensor 10, according to some example embodiments. Specifically, FIG. 3 is a cross-sectional view taken along lines C1-C1' and D1-D1' of FIG. 2.

Referring to FIG. 3, the image sensor 10 may include a first substrate 110, a second substrate 210, a first structure 130 on a first surface 110A of the first substrate 110, and a second structure 230 on a first surface 210A of the second substrate 210. The first structure 130 may be between the first surface 110A of the first substrate 110 and the second structure 230. The first surface 110A of the first substrate 110 may be on (e.g., on top of) the first structure 130.

The first structure 130 and the second structure 230 may be disposed such that the first surface 110A of the first substrate 110 faces the first surface 210A of the second substrate 210, and may be bonded to each other by a bonding member 310.

The first substrate 110 may include the first surface 110A and a second surface 110B, and the second substrate 210 may include the first surface 210A and a second surface 210B. The first surfaces 110A and 210A may correspond to front surfaces of the first and second substrates 110 and 210, respectively, and the second surfaces 110B and 210B may correspond to rear surfaces of the first and second substrates 110 and 210, respectively.

In some example embodiments, each of the first and second substrates 110 and 210 may be a semiconductor substrate as described above with reference to FIG. 1. A type of the first substrate 110 may be identical to or different from a type of the second substrate 210.

The first structure 130 may be disposed on the first surface 110A of the first substrate 110. The first structure 130 may include a plurality of first conductive films 132 separated from each other at different levels in the device region DR, a plurality of first contact plugs 134 mutually connecting the first conductive films 132, and a plurality of first insulating films 136 covering the first conductive films 132 and the first contact plugs 134.

In the device region DR, a plurality of transistors Tr may be disposed within the first structure 130. The transistors Tr may include a transfer transistor, a reset transistor, a source follower transistor, and/or a select transistor. The transistors Tr and the photodiodes 112 are illustrated as being adjacent to each other, but this is only for convenience of description. The transistors Tr and the photodiodes 112 may not be on the same cross-section. The transistors Tr, first conductive films 132, and first contact plugs 134 optionally may not be present below the residual scribe lane region (RSL) of the first substrate 110.

The second structure 230 may be disposed on the first surface 210A of the second substrate 210. The second structure 230 may include a plurality of second conductive films 232 separated from each other at different levels in the device region DR, a plurality of second contact plugs 234 mutually connecting the second conductive films 232, and a plurality of second insulating films 236 covering the second conductive films 232 and the second contact plugs 234. In some example embodiments, the second substrate 210 may be omitted.

The first and second conductive films 132 and 232 and the first and second contact plugs 134 and 234 may each independently include one of Cu, W, WN, Ta, Ti, TaN, TiN, Co, Mn, Al, AlN, and any combination thereof, but inventive concepts are not limited thereto.

The shapes, number, and arrangement structures of the first and second conductive films 132 and 232, the first and second contact plugs 134 and 234, and the transistors Tr, which are illustrated in the device region DR, are merely an example, but may be variously modified within the scope of inventive concepts. One transistor Tr is illustrated as being formed below one photodiode 112 on the first substrate 110, but a plurality of transistors Tr may be formed below one photodiode 112, and a plurality of transistors may also be formed in the device region DR of the second substrate 210.

In the device region DR, a plurality of device isolation structures 410 may be disposed in the first substrate 110. The device isolation structures 410 may be formed by using a deep trench isolation (DTI) process. In the first substrate 110, the photodiodes 112 may be disposed in an active region AR defined by the device isolation structures 410. The photodiodes 112 may have a structure in which n-type ions are injected into a p-type epitaxial layer.

In the device region DR, a plurality of color filters 154 may be disposed on the second surface 110B of the first substrate 110. The color filters 154 may overlap the unit pixels PX, respectively. The color filters 154 may be spaced apart from each other by a node separation pattern 152. A plurality of microlenses 156 may be disposed above the color filters 154, respectively. The microlenses 156 may serve to guide incident light so that the incident light is efficiently incident on the photodiodes 112 of the unit pixels PX. The color filters 154 and the microlenses 156 may be disposed on the second surface 110B of the first substrate 110, not the first surface 110A of the first substrate 110 on which the first structure 130 is disposed. That is, the image sensor 10 according to the embodiment may be a backside illumination image sensor.

In the residual scribe lane region RSL, the barrier structures 430 may have the same height in a third direction D3 and may be disposed in parallel along a first direction D1 and a second direction D2. Four barrier structures 430 are illustrated in FIG. 3, but the number of barrier structures 430 is not limited thereto.

The barrier structures 430 may penetrate the first substrate 110. The barrier structures 430 may be formed such that a width 430A coplanar with the first surface 110A of the first substrate 110 in the second direction D2 is greater than a width 430B coplanar with the second surface 110B of the first substrate 110 in the second direction D2. That is, the barrier structures 430 may each have a trapezoidal cross-sectional shape.

The barrier structures 430 may have the same size. However, inventive concepts are not limited thereto. The barrier structures 430 may have different sizes. Also, the barrier structures 430 may be spaced apart from each other at regular intervals. However, inventive concepts are not limited thereto. The barrier structures 430 may be spaced apart from each other at different intervals.

The barrier structures 430 and the device isolation structures 410 may be formed in the same manufacturing process and by the same manufacturing method. That is, the barrier structures 430 and the device isolation structures 410 may include at least one same material. Also, the barrier structures 430 may be formed by using a DTI process in the same manner as in the device isolation structures 410. Also, the barrier structures 430 and the device isolation structures 410 may be formed by using a damascene process. Also, the barrier structures 430 and the device isolation structures 410 may be formed at the same level of the first substrate 110.

The barrier structures 430 may each include at least one film. The barrier structures 430 may each include a first insulating material and a second insulating material. The first insulating material and the second insulating material may include different materials. For example, the first insulating material may be a silicon oxide film and the second insulating material may be a silicon nitride film. However, the configuration of the barrier structures 430 is not limited thereto. For example, the barrier structures 430 may be a single-layered film including one type of an insulating material or a multi-layered film including a combination of at least three types of insulating materials.

A capping film 158 may be disposed on the second surface 110B of the first substrate 110 so as to cover the barrier structures 430. That is, the barrier structures 430 may not be exposed to the outside. The capping film 158 may include the same material as that of the node separation pattern 152.

Figure 4:
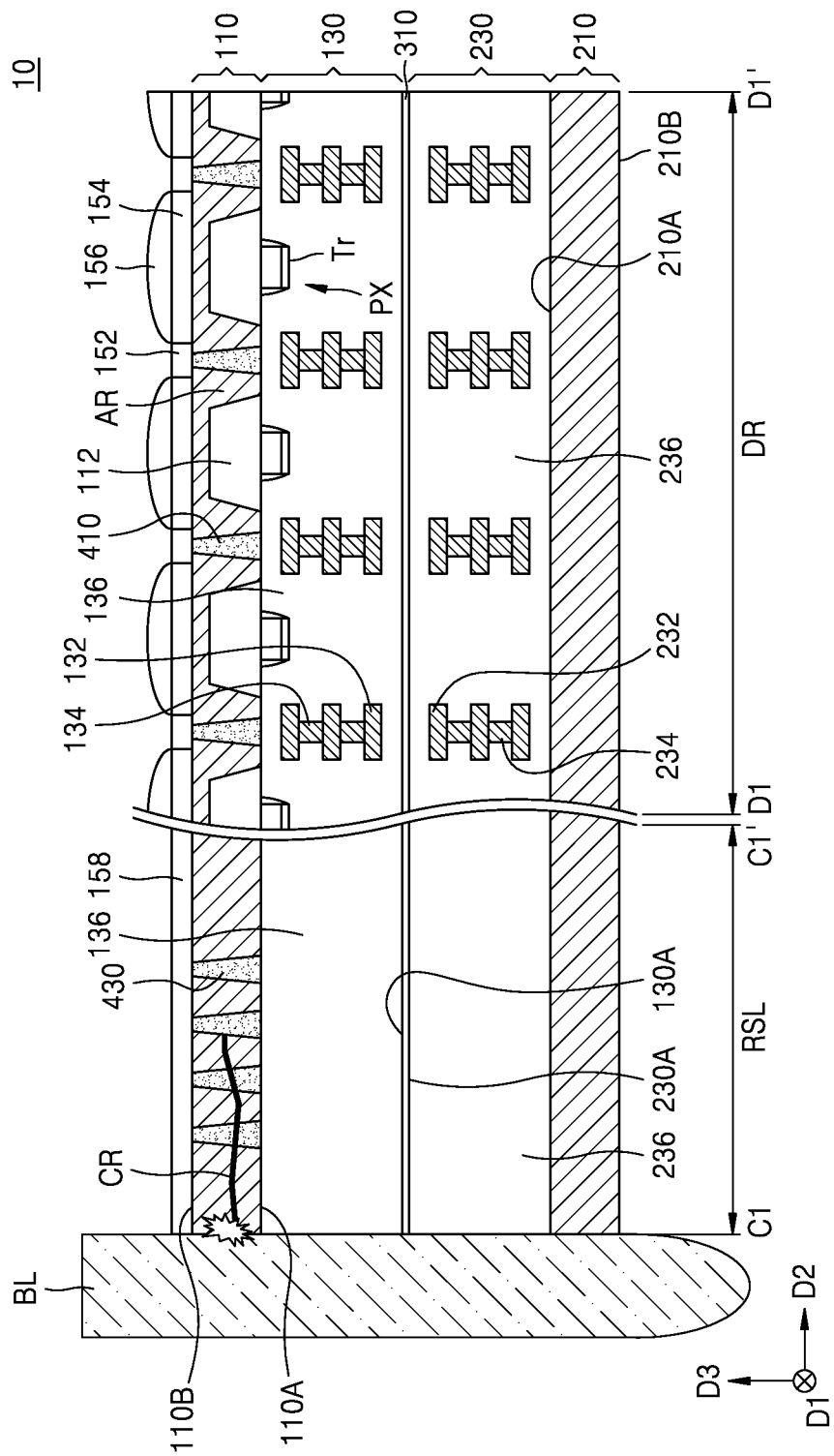
FIG. 4 is a cross-sectional view illustrating a state in which a crack progresses in a scribe lane region during a die sawing process.

FIG. 4 is a cross-sectional view illustrating an aspect of a crack progressing in a scribe lane region during a die sawing process.

Referring to FIG. 4, a sawing blade BL sequentially cuts the first substrate 110, the first structure 130, the bonding member 310, the second structure 230, and the second substrate 210 in the third direction D3 from the second surface 110B of the first substrate 110 to the second surface 210B of the second substrate 210.

While the sawing blade BL cuts the first substrate 110 along the scribe lane region (SL, see FIG. 1), a stress is generated by a physical friction between the sawing blade BL and the first substrate 110. Such a stress causes a crack CR progressing within the first substrate 110. When the crack CR progresses toward the device region DR, the reliability of the image sensor 10 may be deteriorated.

A crack CR starting from the scribe lane region SL may move along the first substrate 110 and disappear because a stress is dispersed when the crack CR meets the barrier structures 430. Although not illustrated, a crack CR starting from above the scribe lane region SL may move along the first substrate 110, progress vertically along interfaces of the barrier structures 430 when meeting the barrier structures 430, and progress toward the second surface 110B of the first substrate 110 without progressing toward the device region DR.

A crack starting from a contact portion between the sawing blade BL and the first substrate 110 and progressing toward the device region DR meets the barrier structures 430. Therefore, the barrier structures 430 may limit and/or prevent the crack CR from progressing toward the device region DR.

Both sidewalls of each of the barrier structures 430 may be flat. That is, since the barrier structures 430 and the first substrate 110 form a bonding interface of different materials and a protrusion is not present, the progress of the crack CR in the second direction D2 may be more effectively limited and/or prevented.

A stress applied to the first substrate 110 during the die sawing process increases a risk of damaging the unit pixels PX. In particular, since the first substrate 110 is a region that the sawing blade BL contacts first during the die sawing process, a stress caused by the die sawing process may be accumulated in the first substrate 110. Therefore, the frequency of occurrence of a crack CR and stress strength may be great as compared with other components of the image sensor 10. That is, a defect caused by the crack CR in the scribe lane region SL of the first substrate 110 may greatly affect the image sensor 10.

In this regard, the progress of the crack CR may be limited and/or prevented by forming the barrier structures 430 in the residual scribe lane region RSL of the first substrate 110. This may reduce the defect of the image sensor 10 and improve the reliability of the image sensor 10 and the productivity of the process of manufacturing the image sensor 10.

Figure 5:
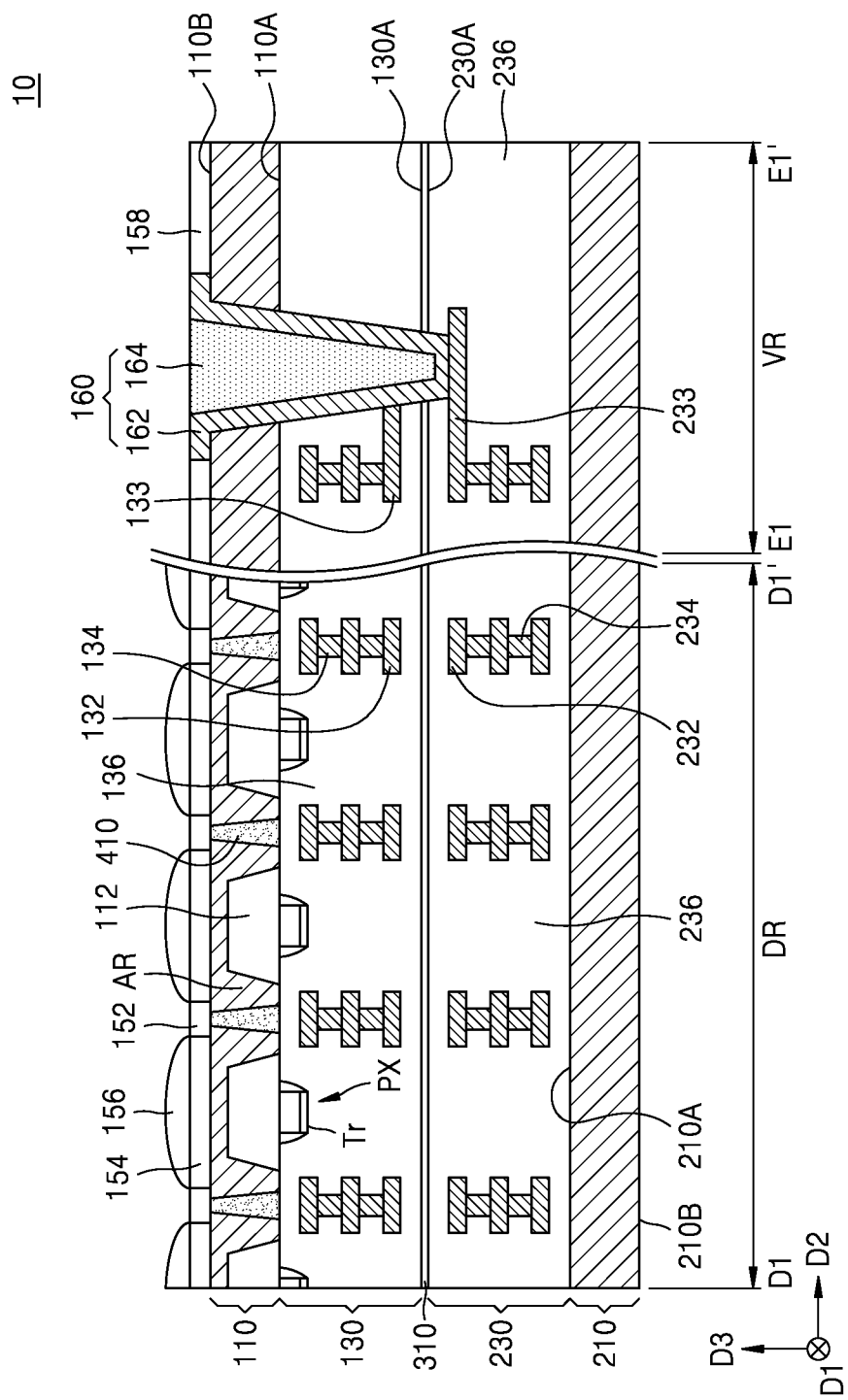
FIG. 5 is a cross-sectional view of a device region and a via region of an image sensor, according to some example embodiments.

FIG. 5 is a cross-sectional view of a device region and a via region of an image sensor, according to some example embodiments. Specifically, FIG. 5 is a cross-sectional view taken along lines D1-D1' and E1-E1' of FIG. 2.

Referring to FIG. 5, the image sensor 10 may include a via structure 160 that penetrates the first substrate 110 and the first structures 130 in the via region VR and penetrates up to a partial upper portion of the second structure 230.

The via structure 160 may be a through silicon via (TSV). The via structure 160 may include a via conductive film 162 conformally formed along a trench and a via filling film 164 filling a space remaining after the formation of the via conductive film 162. The via conductive film 162 may include W, Al, or any combination thereof, and the via filling film 164 may include a carbon-based insulating material, but inventive concepts are not limited thereto.

The via structure 160 may electrically connect a first conductive pad 133 in the first structure 130 to a second conductive pad 233 in the second structure 230. In some example embodiments, the via structure 160 may contact a sidewall of the first conductive pad 133. Also, the via structure 160 may contact an upper surface of the second conductive pad 233.

In some example embodiments, the first conductive pad 133 contacting the via structure 160 may be disposed at the same level as at least a part of the first conductive film 132 in the device region DR. Also, the second conductive pad 233 contacting the via structure 160 may be disposed at the same level as at least a part of the second conductive film 232 in the device region DR.

FIGS. 6A to 6F are cross-sectional views for describing a method of manufacturing an image sensor, according to some example embodiments.

Figure 6A:
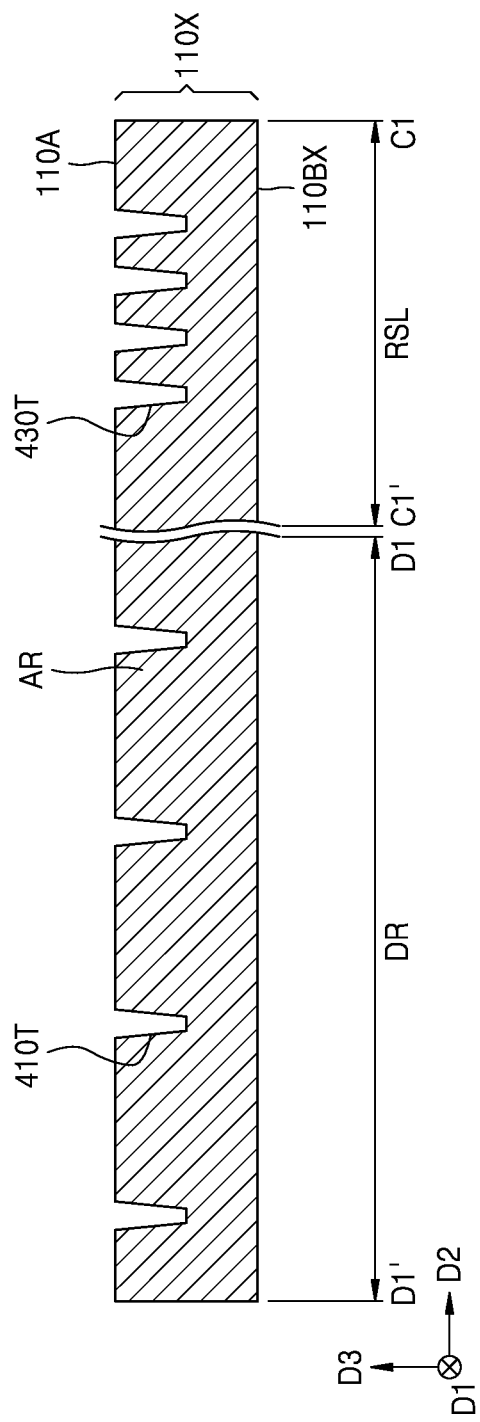

Referring to FIG. 6A, a first substrate 110X may be provided. The first substrate 110X defines a device region DR and a residual scribe lane region RSL and has a flat plate structure with a first surface 110A and a second surface 110BX. The first surface 110A may correspond to a front surface of the first substrate 110X, and the second surface 110BX may correspond to a rear surface of the first substrate 110X.

A plurality of trenches 410T and 430T may be respectively formed in the device region DR and the residual scribe lane region RSL on the first surface 110A of the first substrate 110X. The trenches 410T and 430T may be formed by performing the same exposure process and the same etching process on the first surface 110A of the first substrate 110X. That is, the trenches 410T and 430T may be formed in both the device region DR and the residual scribe lane region RSL by performing a photolithography process once.

The trenches 410T and 430T may be formed by using a wet etching process or a dry etching process. In some example embodiments, a width of an upper portion of each of the trenches 410T and 430T may be greater than a width of a lower portion thereof. The etching process may form each of the trenches 410T and 430T so the trenches 410T and 430T may be tapered downward. That is, the trenches 410T and 430T may each have an inverted trapezoidal cross-sectional shape.

Figure 6B:
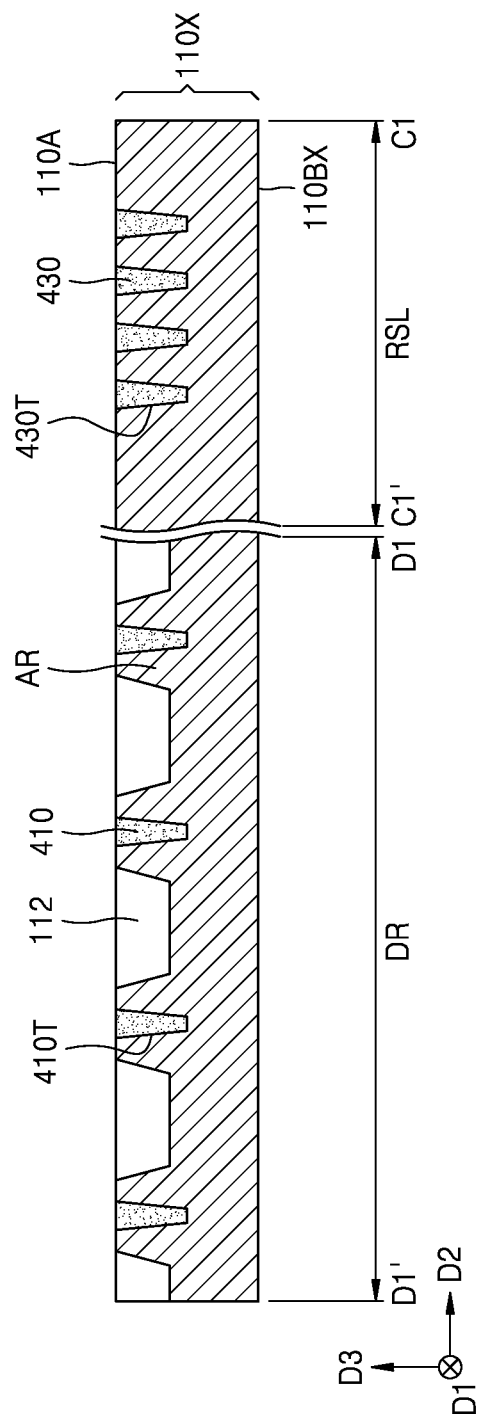

Referring to FIG. 6B, the trenches 410T and 430T may be filled to form device isolation structures 410 in the device region DR and barrier structures 430 in the residual scribe lane region RSL.

In the device region DR, the device isolation structures 410 may be formed by filling the trenches 410T with an insulating material. A plurality of active regions AR may be defined by the device isolation structures 410.

A plurality of photodiodes 112 may be respectively formed in the active regions AR. In some example embodiments, the photodiodes 112 may be formed by using an ion implantation process.

A photoelectric conversion device may be formed in the first substrate 110X so as to generate photoelectric charges corresponding to incident light. For example, the photoelectric conversion device may generate electron-hole pairs corresponding to the incident light and collect electrons or holes. The photoelectric conversion device may be formed by doping impurities, a type of which is different from a type of impurities doped into the first substrate 110X. The photodiode 112 is illustrated as the photoelectric conversion device, but the photoelectric conversion device may include a photodiode, a photo transistor, a photo gate, a pinned photodiode, or any combination thereof.

In the residual scribe lane region RSL, the barrier structures 430 may be formed by filling the trenches 430T with an insulating material. The barrier structures 430 may include the same material as that of the device isolation structures 410.

The barrier structures 430 and the device isolation structures 410 may be formed by using a damascene process. The damascene process will be described in more detail. An insulating material film filling the trenches 410T and 430T may be formed on the first surface 110A of the first substrate 110X. The insulating material film may fill the trenches 410T and 430T having a large aspect ratio with at least one of a silicon oxide and a silicon nitride by using a process having excellent filling capability. Then, an upper portion of the insulating material film may be polished until the first surface 110A of the first substrate 110X is exposed. In this manner, as illustrated in FIG. 6B, the device isolation structures 410 and the barrier structures 430 may be formed in the first substrate 110X.

In some example embodiments, the device isolation structure 410 may function as a DTI and a shallow trench isolation (STI), and the barrier structure 430 may function as a crack prevention structure (or crack limitation structure). A DTI is deeper than a STI.

Figure 6C:
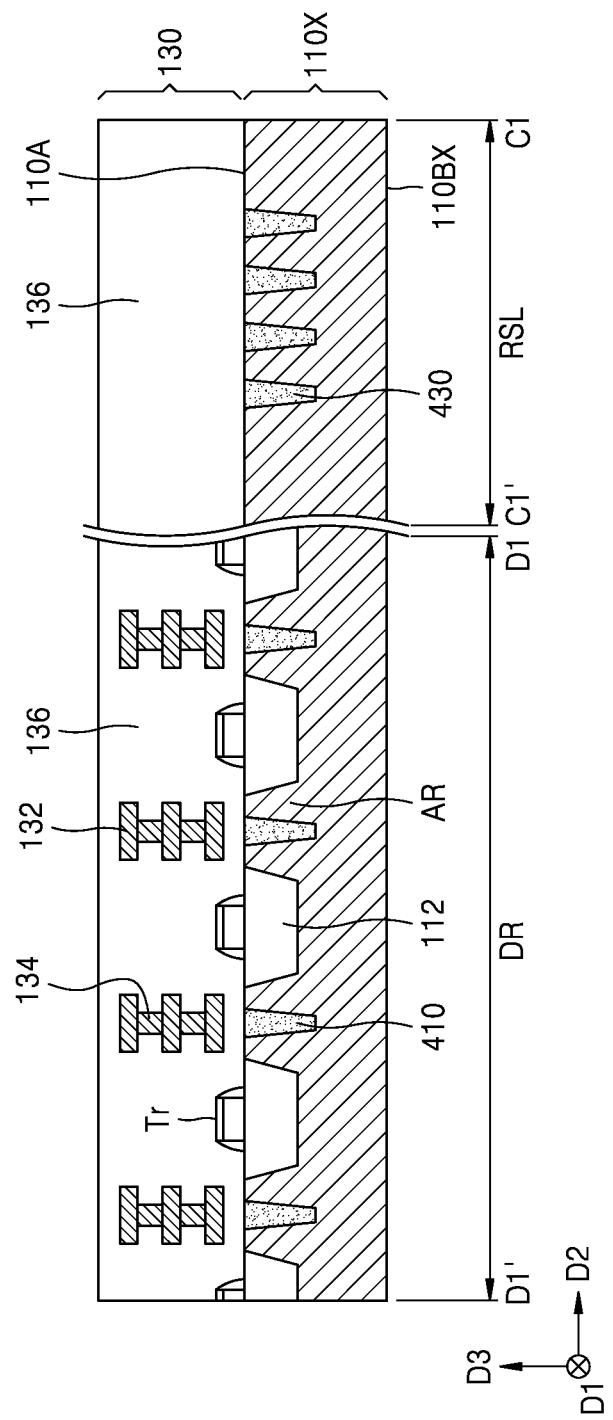

Referring to FIG. 6C, a first structure 130 may be formed on the first surface 110A of the first substrate 110X.

The first structure 130 may include a plurality of transistors Tr, a plurality of first conductive films 132, a plurality of first pads (not illustrated), a plurality of first contact plugs 134, and a plurality of first insulating films 136.

In some example embodiments, the transistors Tr may be formed by forming a gate electrode structure on the first surface 110A of the first substrate 110X and doping impurities into the first substrate 110X on both sides of the gate electrode structure.

In some example embodiments, the transistors Tr may include a transfer transistor, a reset transistor, a source follower transistor, and a select transistor. The number and arrangement of the transistors Tr are not limited to those illustrated in FIG. 6C.

In some example embodiments, the first conductive films 132 and the first conductive pads spaced apart at different levels may be formed by performing a process of forming and patterning a conductive material film at each level. In other embodiments, the first conductive films 132 and first conductive pads may be formed by forming a mold pattern (not illustrated) and performing a damascene process of filling openings of the mold pattern with a conductive material film.

The number of layers and the structures of the first conductive films 132 and the first conductive pads are not limited to those illustrated in FIG. 6B. The number of layers and the structures of the first conductive films 132 and the first conductive pads may be various according to a design of the image sensor.

The first conductive films 132 and the first conductive pads may not be formed in the residual scribe lane region RSL. That is, only the first insulating film 136 may be formed in the residual scribe lane region RSL, but inventive concepts are not limited thereto. The first conductive pads may be formed in a via region (not illustrated).

Figure 6D:
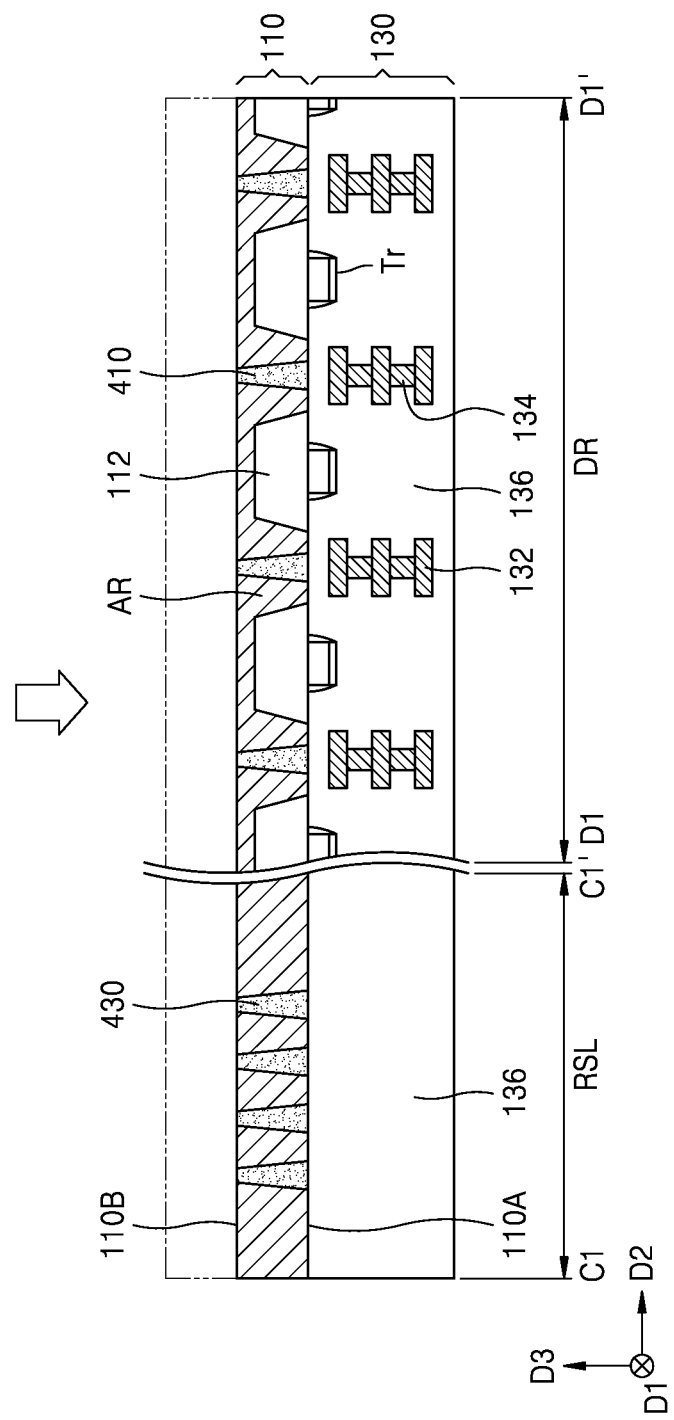

Referring to FIG. 6D, the first substrate 110X may be polished from the second surface (110BX, see FIG. 6C) so as to reduce a thickness of the first substrate (110X, see FIG. 6C).

The polishing process may include a grinding process. The grinding process may be performed to form a first substrate 110 having a first surface 110A and a second surface 110B. The order of the grinding process is not limited to the present embodiment. For example, the grinding process may be performed after a bonding process described below with reference to FIG. 6F.

The grinding process may be performed to expose the device isolation structure 410 and the barrier structure 430. In other words, the grinding process may be performed so that the device isolation structure 410 and the barrier structure 430 completely penetrate the first substrate 110.

In the grinding process, a part of the device isolation structure 410 and a part of the barrier structure 430 may be removed, together with a part of the first substrate 110X.

Referring to FIG. 6E, a second substrate 210 may be provided. The second substrate 210 defines a device region DR and a residual scribe lane region RSL and has a flat plate structure with a first surface 210A and a second surface 210B. The first surface 210A may correspond to a front surface of the second substrate 210, and the second surface 210B may correspond to a rear surface of the second substrate 210.

A second structure 230 may be formed on the first surface 210A of the second substrate 210. The second structure 230 may include a plurality of second conductive films 232, a plurality of second pads (not illustrated), a plurality of second contact plugs 234, and a plurality of second insulating films 236.

In some example embodiments, the second conductive films 232 and the second conductive pads spaced apart at different levels may be formed by performing a process of forming and patterning a conductive material film at each level. In other embodiments, the second conductive films 232 and the second conductive pads may be formed by forming a mold pattern (not illustrated) and performing a damascene process of filling openings of the mold pattern with a conductive material film.

As such, when the second conductive films 232 and the second conductive pads are formed by using the damascene process, the second conductive films 232 and the second conductive pads may each have an inverted trapezoidal cross-sectional shape.

The number of layers and the structures of the second conductive films 232 and the second conductive pads are not limited to those illustrated in FIG. 6E. The number of layers and the structures of the second conductive films 232 and the second conductive pads may be various according to a design of the image sensor.

An area occupied in the second substrate 210 by the device region DR including a plurality of logic devices may be substantially equal to an area occupied in the first substrate (110, see FIG. 6D) by the device region DR including the unit pixels PX. Also, an area occupied by the residual scribe lane region RSL of the second substrate 210 may be substantially equal to an area occupied by the residual scribe lane region RSL of the first substrate 110. Therefore, the first substrate 110 and the second substrate 210 may be symmetrically formed so that the same regions face each other.

In some example embodiments, the second substrate 210 may be omitted. That is, the logic devices may be included in the first substrate 110.

Figure 6F:
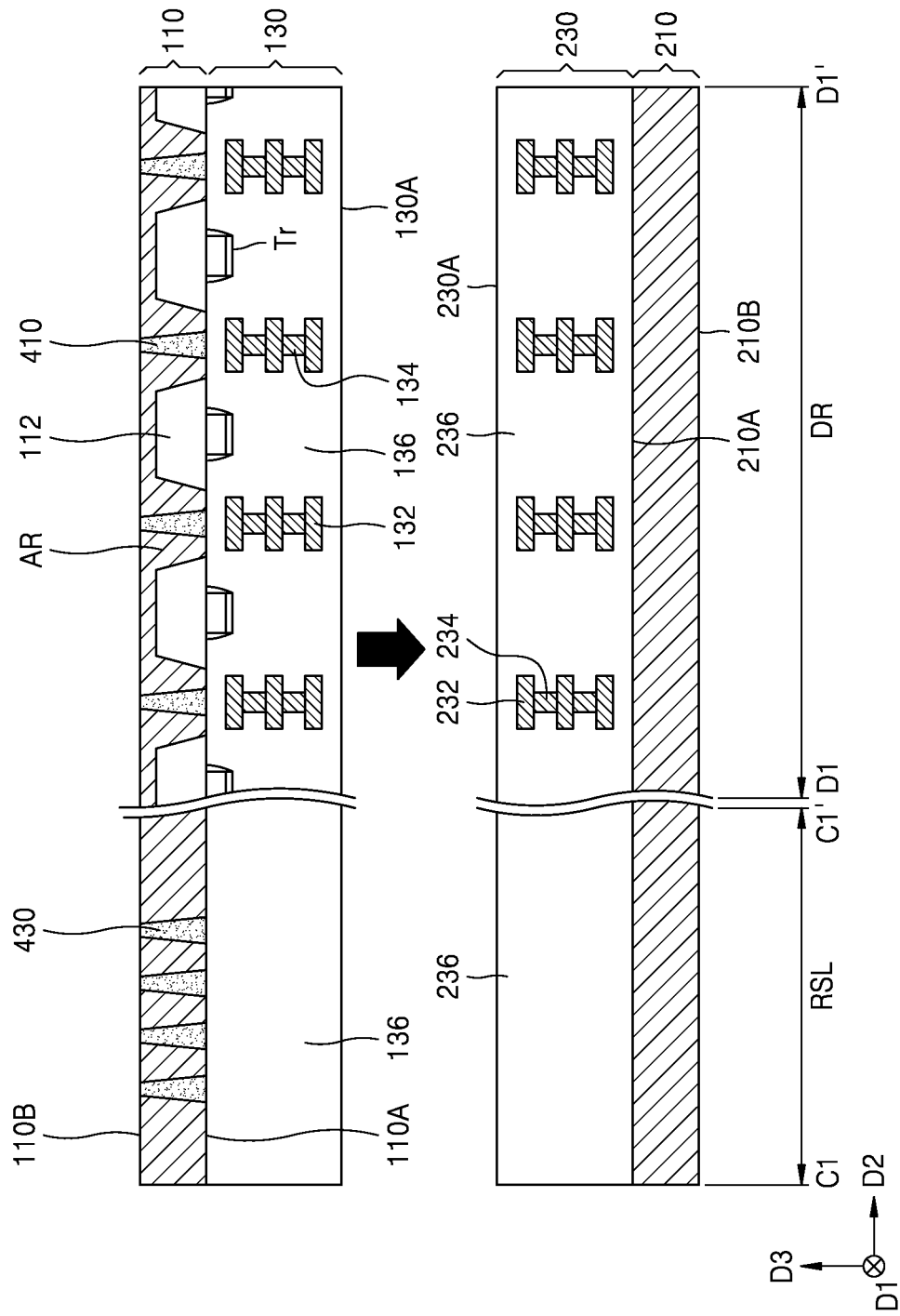

Referring to FIG. 6F, the first surface 110A of the first substrate 110 may face the first surface 210A of the second substrate 210, and a first surface 130A of the first structure 130 may be bonded to a first surface 230A of the second structure 230 by using a bonding member (310, see FIG. 3).

In some example embodiments, the bonding of the first structure 130 and the second structure 230 may be performed by at least one of heating, pressurizing, and plasma processing. In other embodiments, the bonding member 310 may be omitted.

Then, a capping film (158, see FIG. 3) may be formed on the residual scribe lane region RSL, and a node separation pattern (152, see FIG. 3) may be formed on the device region DR. Also, a plurality of color filters (154, see FIG. 3) and a plurality of microlenses (156, see FIG. 3) may be formed to respectively overlap the unit pixels PX in the device region DR.

For reference, a via structure (160, see FIG. 5) may be formed in a via region (VR, see FIG. 5) so as to electrically connect a first conductive pad (133, see FIG. 5) and a second conductive pad (233, see FIG. 5). The forming of the via structure 160 may include forming a trench, conformally forming a via conductive film (162, see FIG. 5) along the trench, and forming a via filling film (164, see FIG. 5) filling a space remaining after the formation of the via conductive film 162.

The first substrate 110 and the second substrate 210 may be separated into a plurality of image sensors 10 by performing a die sawing process along the scribe lane region (SL, see FIG. 1) of the first substrate 110 and the second substrate 210 bonded to each other.

Therefore, an aspect of inventive concepts provides the image sensor 10 in which the barrier structures are formed to block a progress of crack generated during the die sawing process, thereby limiting and/or preventing a defect of unit pixels PX due to the crack generated in the scribe lane region SL. Consequently, it is possible to improve the reliability of the image sensor 10 and the productivity of the process of manufacturing the image sensor 10.

Figure 7:
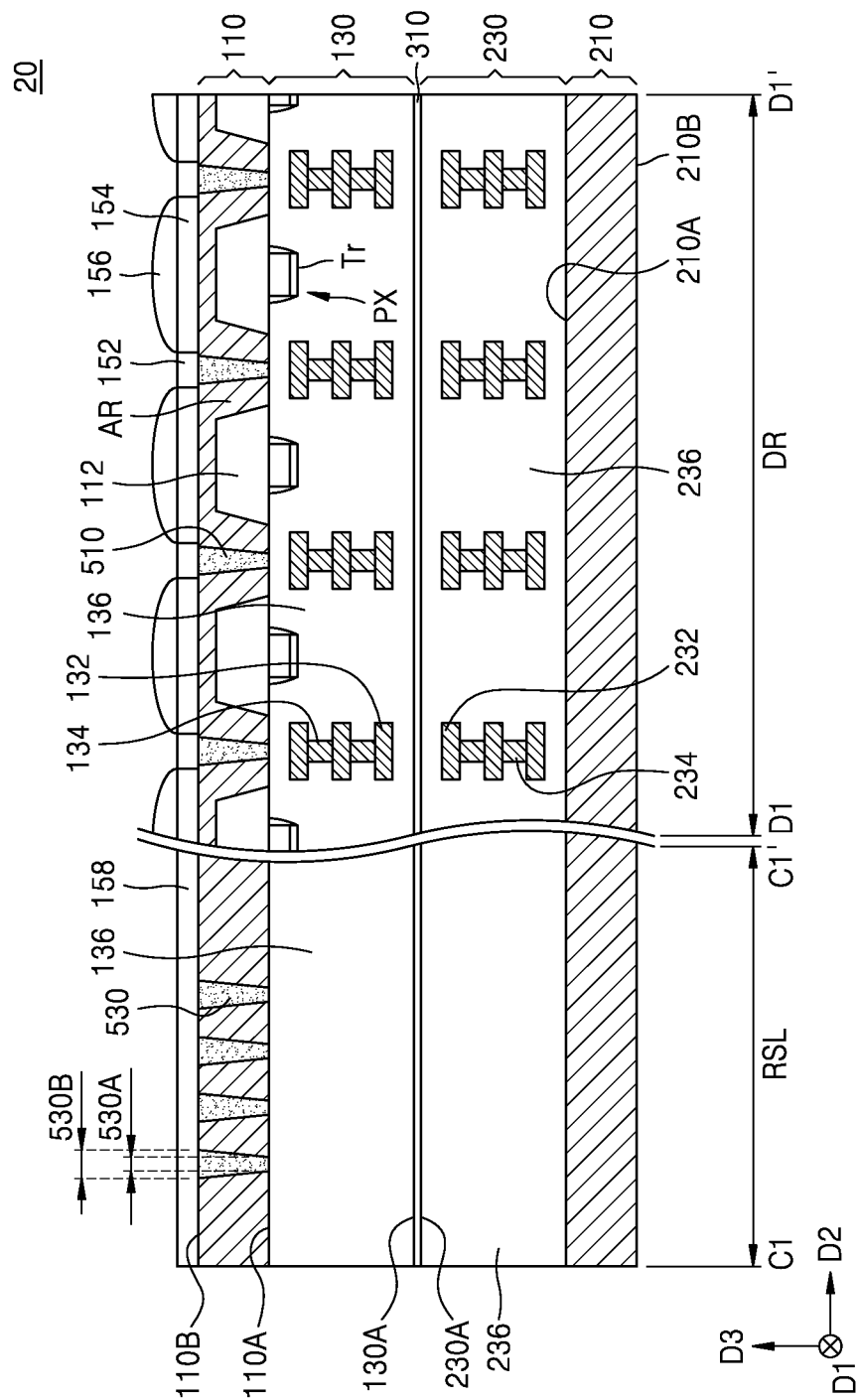
FIG. 7 is a cross-sectional view of a residual scribe lane region and a device region of an image sensor, according to some example embodiments.

FIG. 7 is a cross-sectional view of a residual scribe lane region and a device region of an image sensor 20, according to some example embodiments. Specifically, FIG. 7 is a cross-sectional view taken along lines C1-C1' and D1-D1' of FIG. 2.

In FIG. 7, the same reference numerals as those used in FIG. 3 refer to the same members, and descriptions provided above will be briefly described or omitted for conciseness. The image sensor 20 has a structure similar to that of the image sensor 10 described above with reference to FIG. 3 except for the configurations of device isolation structures 510 and barrier structures 530.

Referring to FIG. 7, the image sensor 20 may include a first substrate 110, a second substrate 210, a first structure 130 on a first surface 110A of the first substrate 110, and a second structure 230 on a first surface 210A of the second substrate 210. The first structure 130 and the second structure 230 may be disposed such that the first surface 110A of the first substrate 110 faces the first surface 210A of the second substrate 210, and may be bonded to each other by a bonding member 310.

The first substrate 110 may include the first surface 110A and a second surface 110B, and the second substrate 210 may include the first surface 210A and a second surface 210B. The first surfaces 110A and 210A may correspond to front surfaces of the first and second substrates 110 and 210, respectively, and the second surfaces 110B and 210B may correspond to rear surfaces of the first and second substrates 110 and 210, respectively.

In some example embodiments, each of the first and second substrates 110 and 210 may be a semiconductor substrate as described above with reference to FIG. 1.

In the device region DR, a plurality of device isolation structures 510 may be disposed in the first substrate 110. The device isolation structures 510 may be formed by using a DTI process.

In the residual scribe lane region RSL, the barrier structures 530 may have the same length in a third direction D3 and may be disposed in parallel along a first direction D1 and a second direction D2. Four barrier structures 530 are illustrated in FIG. 7, but the number of barrier structures 530 is not limited thereto.

The barrier structures 530 may penetrate the first substrate 110. The barrier structures 530 may be formed such that a width 530A coplanar with the first surface 110A of the first substrate 110 in the second direction D2 is less than a width 530B coplanar with the second surface 110B of the first substrate 110 in the second direction D2. That is, the barrier structures 530 may each have an inverted trapezoidal cross-sectional shape.

The barrier structures 530 may have the same size. However, inventive concepts are not limited thereto. The barrier structures 530 may have different sizes. Also, the barrier structures 530 may be spaced apart from each other at regular intervals. However, inventive concepts are not limited thereto. The barrier structures 530 may be spaced apart from each other at different intervals.

The barrier structures 530 and the device isolation structures 510 may be formed in the same manufacturing process and by the same manufacturing method. That is, the barrier structures 530 and the device isolation structures 510 may include at least one same material. Also, the barrier structures 530 may be formed by using a DTI process in the same manner as in the device isolation structures 510. Also, the barrier structures 530 and the device isolation structures 510 may be formed by using a damascene process. Also, the barrier structures 530 and the device isolation structures 510 may be formed at the same level of the first substrate 110.

That is, the image sensor 20 may be a backside illumination image sensor.

Figure 8A:
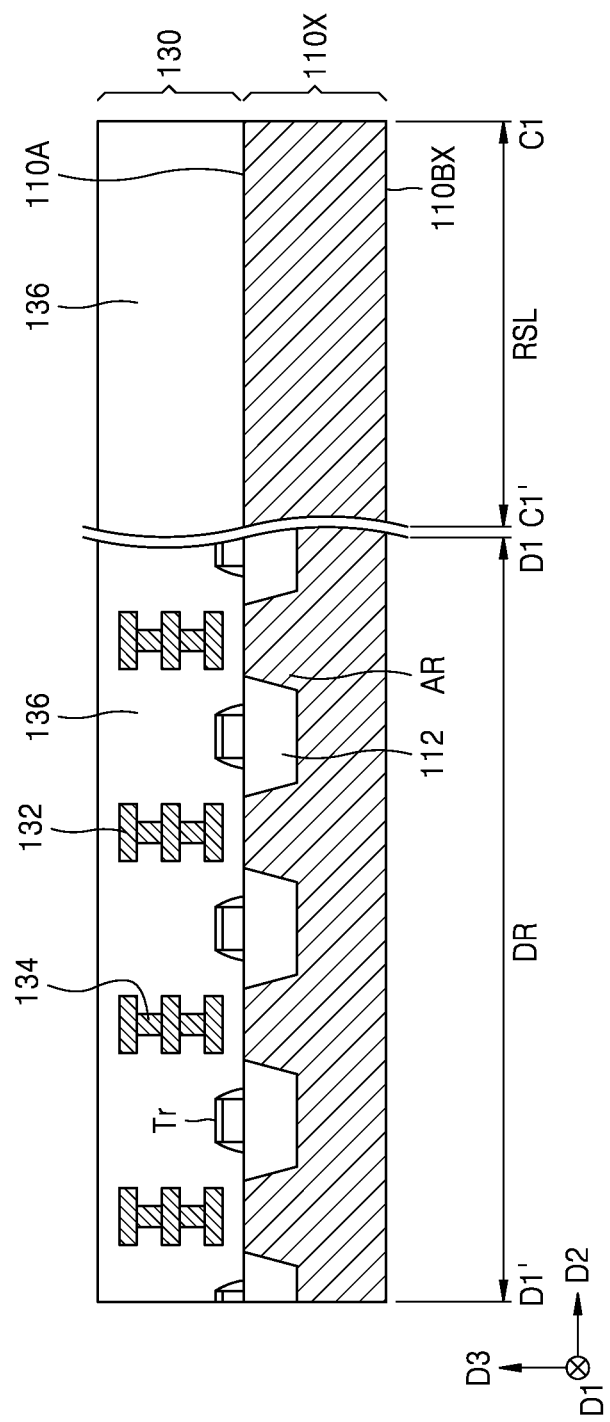
FIGS. 8A to 8C are cross-sectional views for describing a method of manufacturing an image sensor, according to some example embodiments.
Figure 8B:
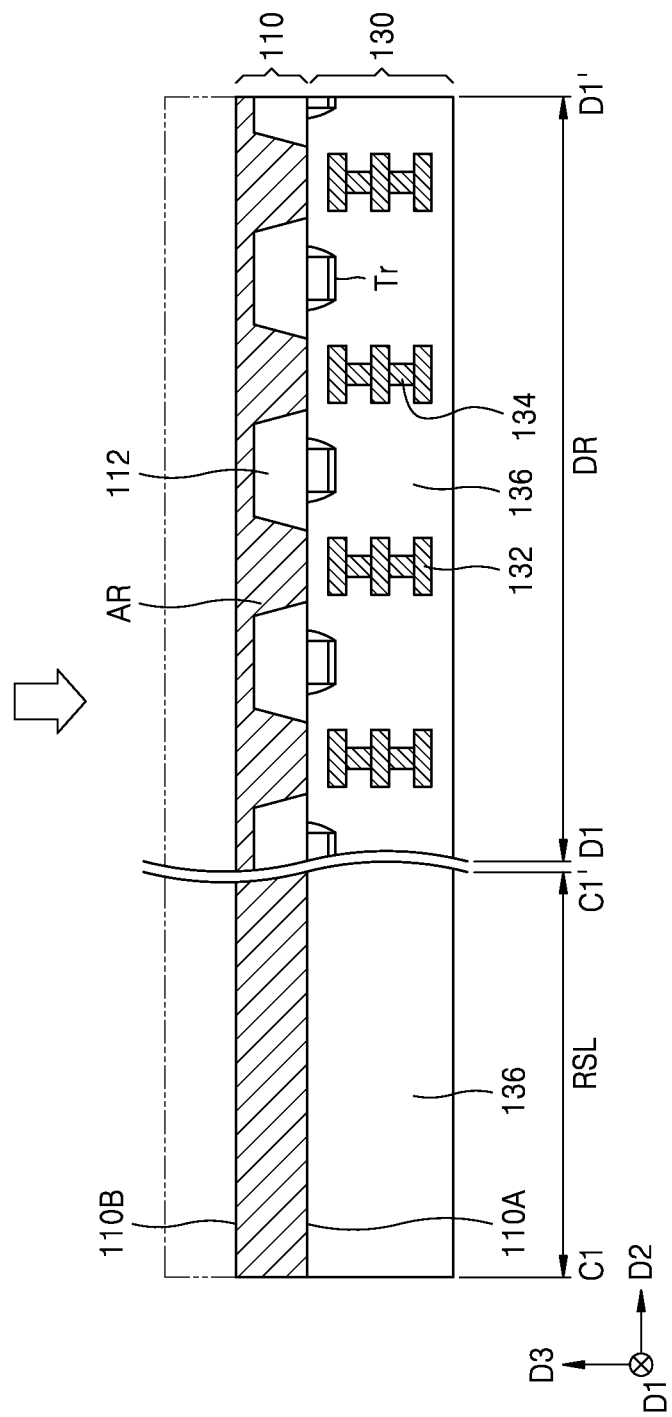
Figure 8C:
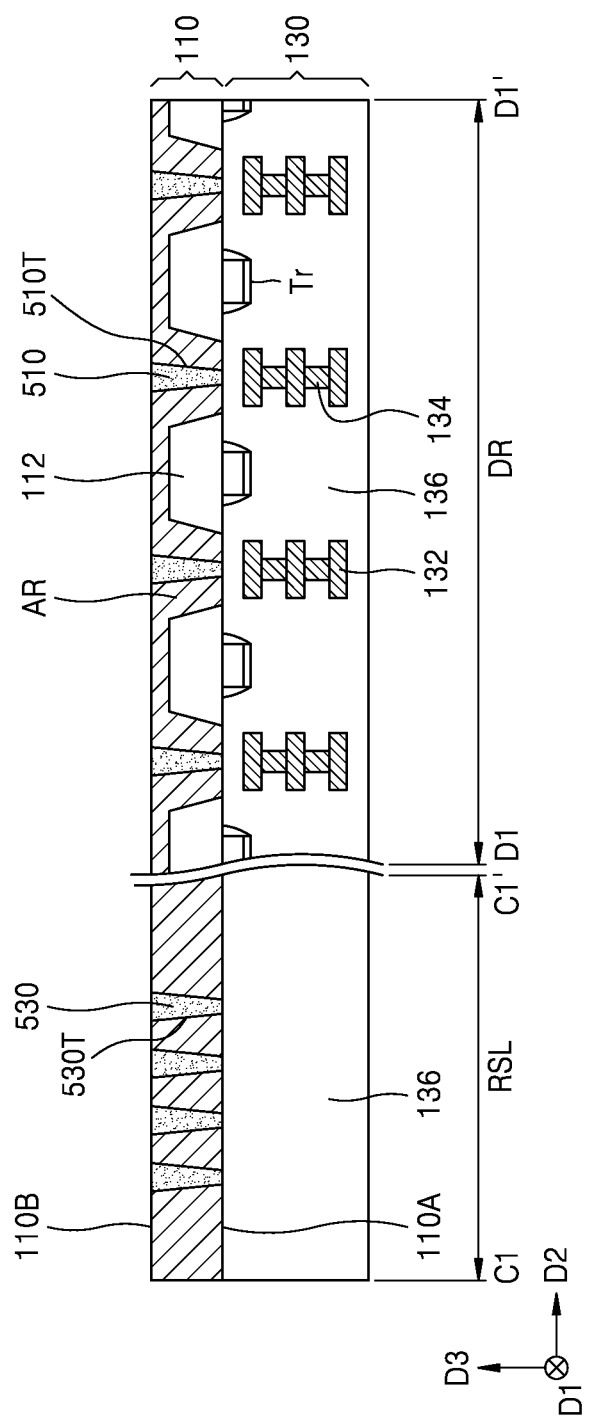

FIGS. 8A to 8C are cross-sectional views for describing a method of manufacturing an image sensor, according to some example embodiments.

Referring to FIG. 8A, a first substrate 110X may be provided. The first substrate 110X defines a device region DR and a residual scribe lane region RSL and has a flat plate structure with a first surface 110A and a second surface 110BX. The first surface 110A may correspond to a front surface of the first substrate 110X, and the second surface 110BX may correspond to a rear surface of the first substrate 110X.

A plurality of active regions AR may be defined in the first substrate 110X. A plurality of photodiodes 112 may be respectively formed in the active regions AR. In some example embodiments, the photodiodes 112 may be formed by using an ion implantation process.

The first structure 130 may include a plurality of transistors Tr, a plurality of first conductive films 132, a plurality of first pads (not illustrated), a plurality of first contact plugs 134, and a plurality of first insulating films 136.

In some example embodiments, the transistors Tr may be formed by forming a gate electrode structure on the first surface 110A of the first substrate 110X and doping impurities into the first substrate 110X on both sides of the gate electrode structure.

In some example embodiments, the transistors Tr may include a transfer transistor, a reset transistor, a source follower transistor, and a select transistor. The number and arrangement of the transistors Tr are not limited to those illustrated in FIG. 7.

In some example embodiments, the first conductive films 132 and the first conductive pads spaced apart at different levels may be formed by performing a process of forming and patterning a conductive material film at each level. In other embodiments, the first conductive films 132 and the first conductive pads may be formed by forming a mold pattern (not illustrated) and performing a damascene process of filling openings of the mold pattern with a conductive material film. The number of layers and the structures of the first conductive films 132 and the first conductive pads are not limited to those illustrated in FIG. 7. The number of layers and the structures of the first conductive films 132 and the first conductive pads may be various according to a design of the image sensor.

The first conductive films 132 and the first conductive pads may not be formed in the residual scribe lane region RSL. That is, only the first insulating film 136 may be formed in the residual scribe lane region RSL, but inventive concepts are not limited thereto.

Referring to FIG. 8B, the first substrate (110X, see FIG. 8A) may be polished from the second surface (110BX, see FIG. 8A) so as to reduce a thickness of the first substrate 110X.

The polishing process may include a grinding process. The grinding process may be performed to form a first substrate 110 having a first surface 110A and a second surface 110B. The order of the grinding process is not limited to the present embodiment.

The grinding process may be performed to grind the first substrate 110 to have a sufficient thickness to form device isolation structures (510, see FIG. 8C) and barrier structures (530, see FIG. 8C) in a subsequent process. In other words, the grinding process may be performed to grind the first substrate 110 to have a sufficient thickness so that the device isolation structures 510 and the barrier structures 530 completely penetrate the first substrate 110.

Referring to FIG. 8C, a plurality of trenches 510T and 530T may be respectively formed in the device region DR and the residual scribe lane region RSL on the second surface 110B of the first substrate 110. The trenches 510T and 530T may be formed by performing the same exposure process and the same etching process on the second surface 110B of the first substrate 110. That is, the trenches 510T and 530T may be formed in both the device region DR and the residual scribe lane region RSL by performing a photolithography process once.

The trenches 510T and 530T may be formed by using a wet etching process or a dry etching process. In some example embodiments, a width of an upper portion of each of the trenches 510T and 530T may be greater than a width of a lower portion thereof. The etching process may form the trenches 510T and 530T so each of the trenches 510T and 530T may be tapered downward.

The trenches 510T and 530T may be filled to form device isolation structures 510 in the device region DR and barrier structures 530 in the residual scribe lane region RSL. In the device region DR, the device isolation structures 510 may be formed by filling the trenches 510T with an insulating material. That is, the device isolation structures 510 may be formed between the active regions AR.

In the residual scribe lane region RSL, the barrier structures 530 may be formed by filling the trenches 530T with an insulating material.

The device isolation structures 510 and the barrier structures 530 may be formed by using a damascene process.

Since those of ordinary skill in the art can perform subsequent processes by applying processes equal or similar to those described above with reference to FIGS. 6E and 6F, descriptions provided above will be omitted for conciseness.

The first substrate 110 may be bonded to the second substrate (210, see FIG. 7), and an image sensor (20, see FIG. 7) may be manufactured through a die sawing process.

Figure 9:
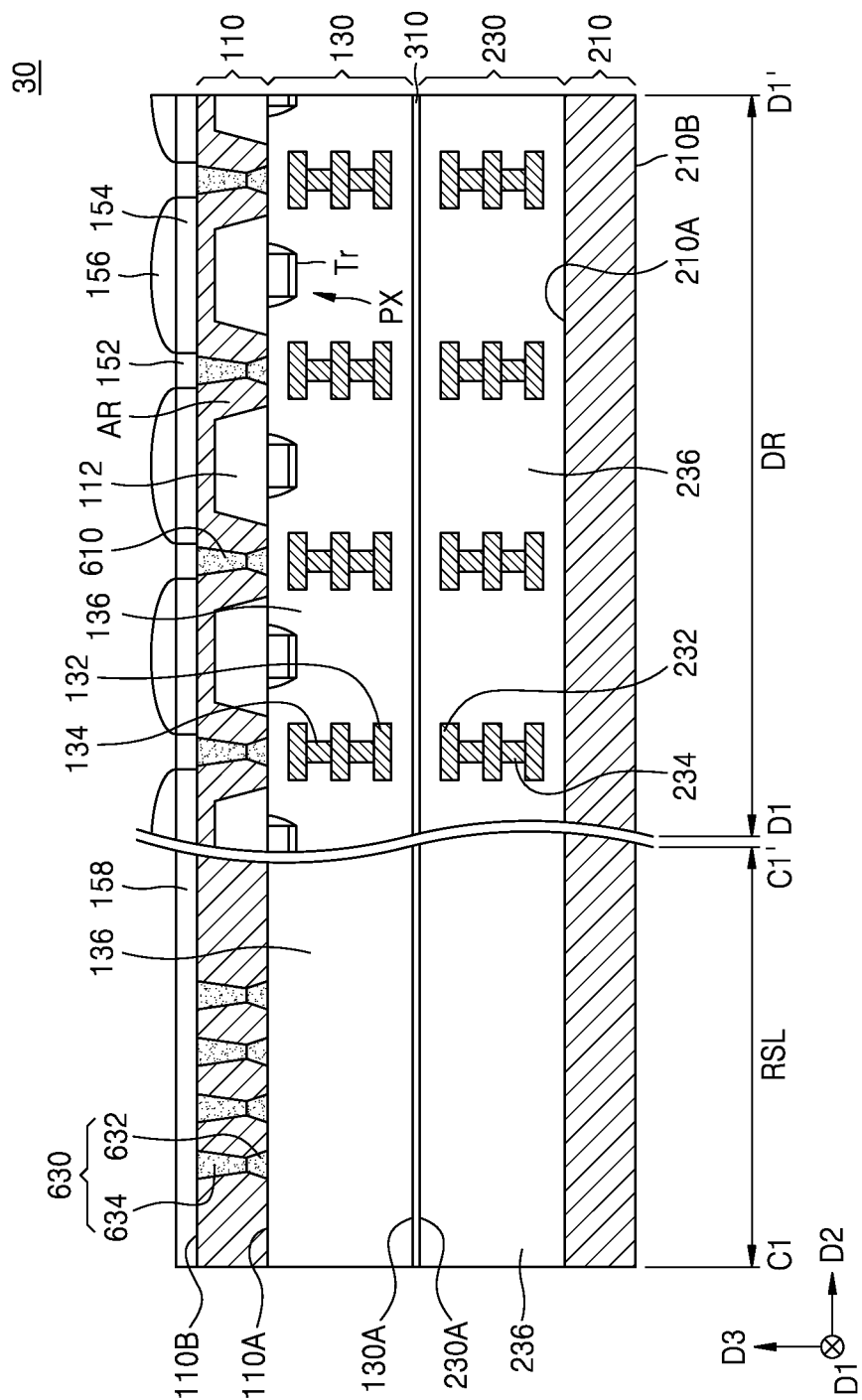
FIG. 9 is a cross-sectional view of a residual scribe lane region and a device region of an image sensor, according to some example embodiments.

FIG. 9 is a cross-sectional view of a residual scribe lane region and a device region of an image sensor 30, according to some example embodiments. Specifically, FIG. 9 is a cross-sectional view taken along lines C1-C1' and D1-D1' of FIG. 2.

In FIG. 9, the same reference numerals as those used in FIG. 3 refer to the same members, and descriptions provided above will be briefly described or omitted for conciseness. The image sensor 30 has a structure similar to that of the image sensor 10 described above with reference to FIG. 3 except for the configurations of device isolation structures 610 and barrier structures 630.

Referring to FIG. 9, the image sensor 30 may include a first substrate 110, a second substrate 210, a first structure 130 on a first surface 110A of the first substrate 110, and a second structure 230 on a first surface 210A of the second substrate 210. The first structure 130 and the second structure 230 may be disposed such that the first surface 110A of the first substrate 110 faces the first surface 210A of the second substrate 210, and may be bonded to each other by a bonding member 310.

The first substrate 110 may include the first surface 110A and a second surface 110B, and the second substrate 210 may include the first surface 210A and a second surface 210B. The first surfaces 110A and 210A may correspond to front surfaces of the first and second substrates 110 and 210, respectively, and the second surfaces 110B and 210B may correspond to rear surfaces of the first and second substrates 110 and 210, respectively.

In some example embodiments, each of the first and second substrates 110 and 210 may be a semiconductor substrate as described above with reference to FIG. 1.

In the device region DR, a plurality of device isolation structures 610 may be disposed in the first substrate 110. The device isolation structures 610 may be formed by using an STI process and a DTI process.

In the residual scribe lane region RSL, the barrier structures 630 may have the same length in a third direction D3 and may be disposed in parallel along a first direction D1 and a second direction D2. Four barrier structures 630 are illustrated in FIG. 9, but the number of barrier structures 630 is not limited thereto.

The barrier structures 630 may penetrate the first substrate 110. Each of the barrier structures 630 may be a combination of a first barrier structure 632 having a trapezoidal cross-sectional shape from the first surface 110A of the first substrate 110 and a second barrier structure 634 having an inverted trapezoidal cross-sectional shape from the second surface 110B of the first substrate 110. That is, each of the barrier structures 630 may be a combination of an inverted trapezoidal cross-section and a trapezoidal cross-section.

The barrier structures 630 may have the same size. However, inventive concepts are not limited thereto. The barrier structures 630 may have different sizes. Also, the barrier structures 630 may be spaced apart from each other at regular intervals. However, inventive concepts are not limited thereto. The barrier structures 630 may be spaced apart from each other at different intervals.

The barrier structures 630 and the device isolation structures 610 may be formed in the same manufacturing process and by the same manufacturing method. That is, the barrier structures 630 and the device isolation structures 610 may include at least one same material. Also, the barrier structures 630 may be formed by using an STI process and a DTI process in the same manner as in the device isolation structures 610. Also, the barrier structures 630 and the device isolation structures 610 may be formed by using a damascene process. Also, the barrier structures 630 and the device isolation structures 610 may be formed at the same level of the first substrate 110.

Figure 10A:
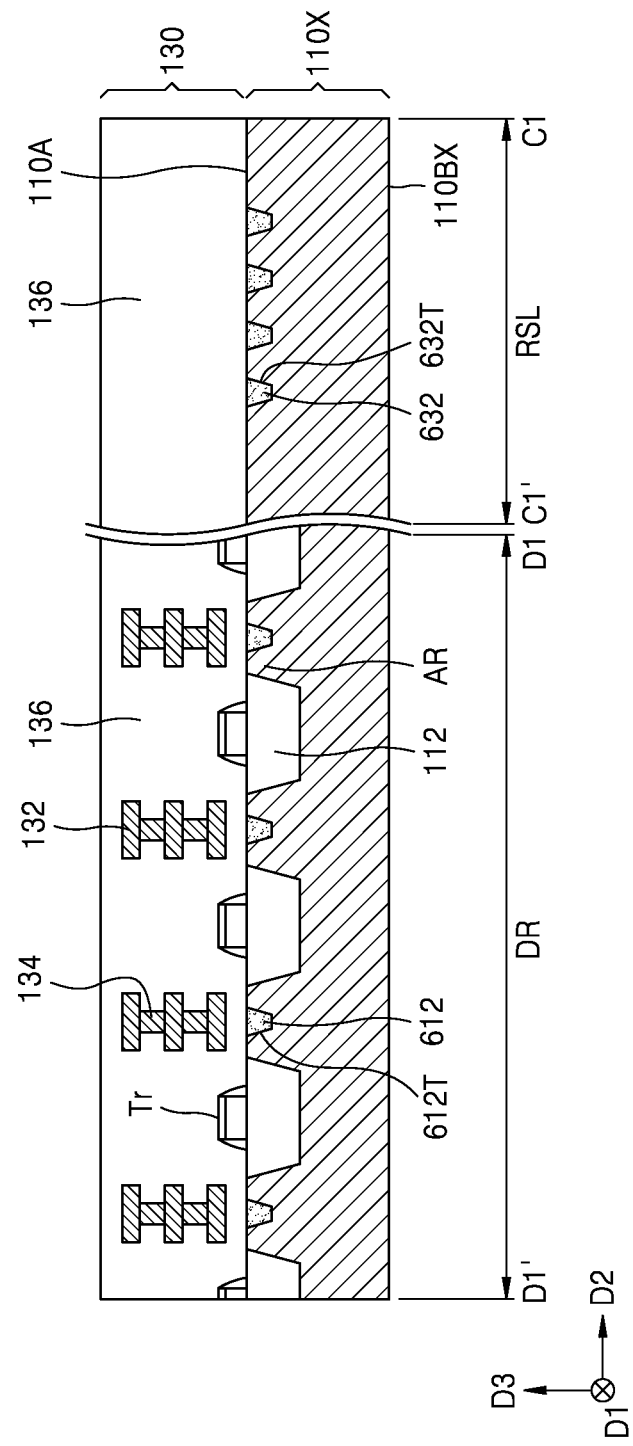
FIGS. 10A to 10C are cross-sectional views for describing a method of manufacturing an image sensor, according to some example embodiments.
Figure 10B:
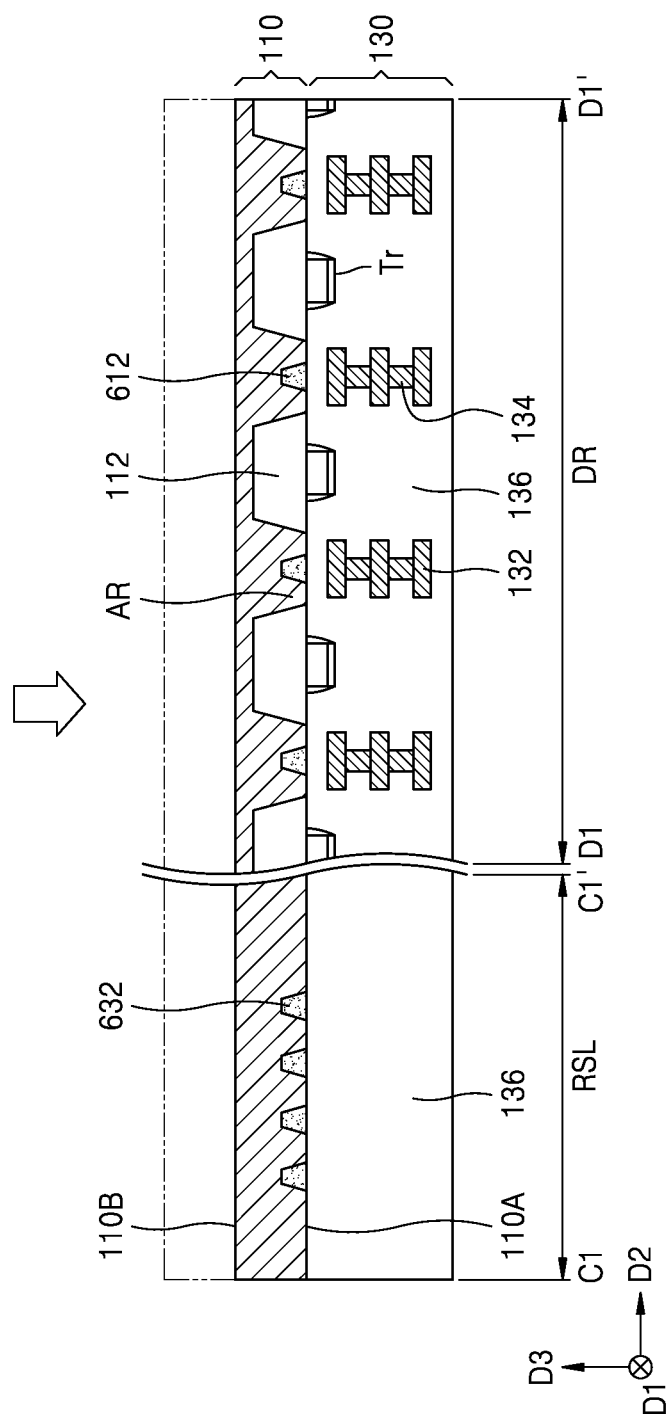
Figure 10C:
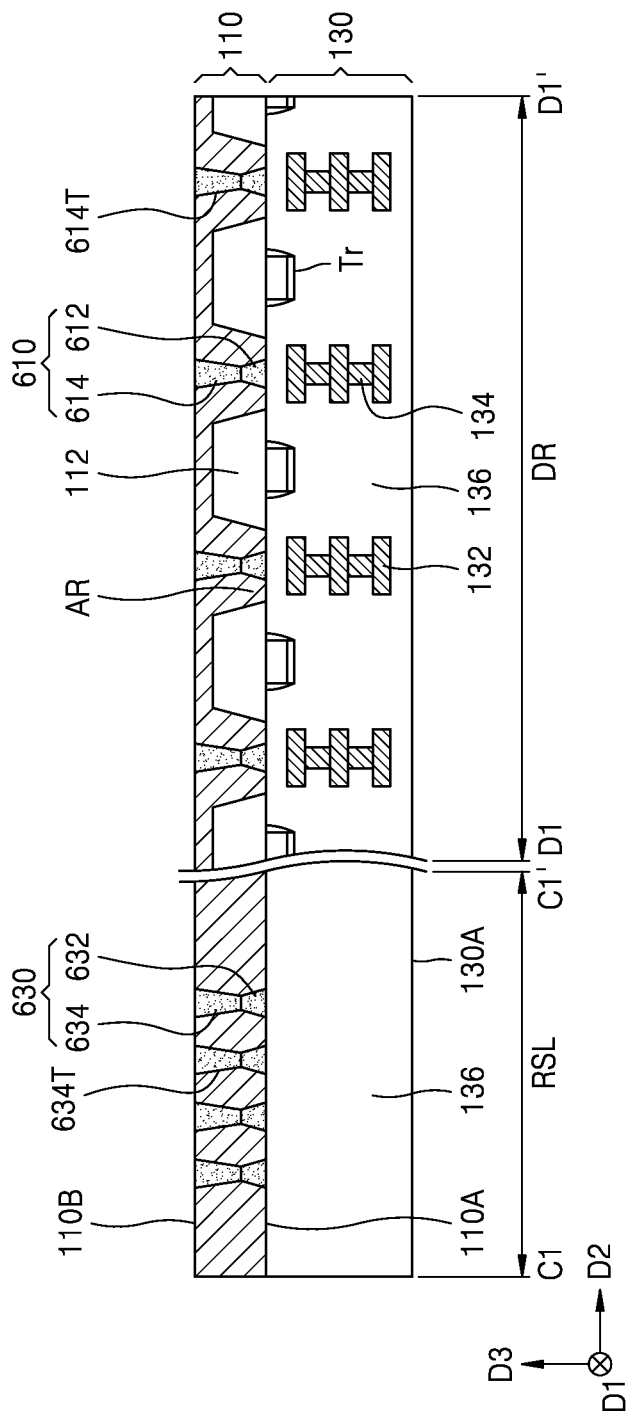

FIGS. 10A to 10C are cross-sectional views for describing a method of manufacturing an image sensor, according to some example embodiments.

Referring to FIG. 10A, a first substrate 110X may be provided. The first substrate 110X defines a device region DR and a residual scribe lane region RSL and has a flat plate structure with a first surface 110A and a second surface 110BX. The first surface 110A may correspond to a front surface of the first substrate 110X, and the second surface 110BX may correspond to a rear surface of the first substrate 110X.

A plurality of first trenches 612T and 632T may be respectively formed in the device region DR and the residual scribe lane region RSL on the first surface 110A of the first substrate 110X. The first trenches 612T and 632T may be formed by performing the same exposure process and the same etching process on the first surface 110A of the first substrate 110X. That is, the first trenches 612T and 632T may be formed in both the device region DR and the residual scribe lane region RSL by performing a photolithography process once.

The first trenches 612T and 632T may be formed by using a wet etching process or a dry etching process. In some example embodiments, a width of an upper portion of each of the first trenches 612T and 632T may be greater than a width of a lower portion thereof. This is characteristics of the etching process of forming the first trenches 612T and 632T, and each of the first trenches 612T and 632T may be tapered downward.

The first trenches 612T and 632T may be filled to form first device isolation structures 612 in the device region DR and first barrier structures 632 in the residual scribe lane region RSL. In the device region DR, the first device isolation structures 612 may be formed by filling the first trenches 612T with an insulating material. A plurality of active regions AR may be defined by the first device isolation structures 612.

A plurality of photodiodes 112 may be respectively formed in the active regions AR. In some example embodiments, the photodiodes 112 may be formed by using an ion implantation process.

In the residual scribe lane region RSL, the first barrier structures 632 may be formed by filling the first trenches 632T with an insulating material. The first barrier structures 632 may include the same material as that of the first device isolation structures 612.

The first barrier structures 632 and the first device isolation structures 612 may each be an STI.

The first structure 130 may be disposed on the first surface 110A of the first substrate 110X. The first structure 130 may include a plurality of transistors Tr, a plurality of first conductive films 132, a plurality of first pads (not illustrated), a plurality of first contact plugs 134, and a plurality of first insulating films 136.

In some example embodiments, the transistors Tr may be formed by forming a gate electrode structure on the first surface 110A of the first substrate 110X and doping impurities into the first substrate 110X on both sides of the gate electrode structure.

In some example embodiments, the transistors Tr may include a transfer transistor, a reset transistor, a source follower transistor, and a select transistor. The number and arrangement of the transistors Tr are not limited to those illustrated in FIG. 10A.

In some example embodiments, the first conductive films 132 and the first conductive pads spaced apart at different levels may be formed by performing a process of forming and patterning a conductive material film at each level. In other embodiments, the first conductive films 132 and the first conductive pads may be formed by forming a mold pattern (not illustrated) and performing a damascene process of filling openings of the mold pattern with a conductive material film. The number of layers and the structures of the first conductive films 132 and the first conductive pads are not limited to those illustrated in FIG. 10A. The number of layers and the structures of the first conductive films 132 and the first conductive pads may be various according to a design of the image sensor.

The first conductive films 132 and the first conductive pads may not be formed in the residual scribe lane region RSL. That is, only the first insulating film 136 may be formed in the residual scribe lane region RSL, but inventive concepts are not limited thereto.

Referring to FIG. 10B, the first substrate (110X, see FIG. 10A) may be polished from the second surface (110BX, see FIG. 10A) so as to reduce a thickness of the first substrate 110X.

The polishing process may include a grinding process. The grinding process may be performed to form a first substrate 110 having a first surface 110A and a second surface 110B. The order of the grinding process is not limited to the present embodiment.

The grinding process may be performed not to expose the first device isolation structures 612 and the first barrier structures 632. The grinding process may be performed to grind the first substrate 110 to a sufficient thickness to form second device isolation structures (614, see FIG. 10C) and second barrier structures (634, see FIG. 10C) in a subsequent process. In other words, the grinding process may be performed to grind the first substrate 110 to have a sufficient thickness so that device isolation structures 610 (610, see FIG. 10C) and barrier structures (630, see FIG. 10C) completely penetrate the first substrate 110.

Referring to FIG. 10C, a plurality of second trenches 614T and 634T may be respectively formed in the device region DR and the residual scribe lane region RSL on the first surface 110A of the first substrate 11110X. The second trenches 614T and 634T may be formed by performing the same exposure process and the same etching process on the second surface 110B of the first substrate 110X. That is, the second trenches 614T and 634T may be formed in both the device region DR and the residual scribe lane region RSL by performing a photolithography process once.

The second trenches 614T and 634T may be formed by using a wet etching process or a dry etching process. In some example embodiments, a width of an upper portion of each of the second trenches 614T and 634T may be greater than a width of a lower portion thereof. This is characteristics of the etching process of forming the second trenches 614T and 634T, and each of the second trenches 614T and 634T may be tapered downward.

The second trenches 614T and 634T may be filled to form second device isolation structures 614 in the device region DR and second barrier structures 634 in the residual scribe lane region RSL. In the device region DR, the second device isolation structures 614 may be formed by filling the second trenches 614T with an insulating material. Consequently, device isolation structures 610 may be formed in the device region DR.

In the residual scribe lane region RSL, the second barrier structures 634 may be formed by filling the second trenches 634T with an insulating material. Consequently, barrier structures 630 may be formed in the residual scribe lane region RSL.

The device isolation structures 610 and the barrier structures 630 may be formed by using a damascene process.

Since those of ordinary skill in the art can perform subsequent processes by applying processes equal or similar to those described above with reference to FIGS. 6E and 6F, descriptions provided above will be omitted for conciseness.

The first substrate 110 may be bonded to the second substrate (210, see FIG. 9), and an image sensor (30, see FIG. 9) may be manufactured through a die sawing process.

FIGS. 11A to 11D are plan views of scribe lane regions of an image sensor, according to some example embodiments.

Specifically, FIGS. 11A to 11D are enlarged plan views of the scribe lane region SL in a portion B 1 of FIG. 1.

Referring to FIGS. 11A to 11D, the scribe lane region SL may extend in a first direction D1 and a second direction D2 perpendicular to the first direction D1. The scribe lane region SL may have a straight lane shape having a constant width.

The scribe lane region SL may be divided into a first region surrounding edges of the image sensors (10, see FIG. 1) in portions adjacent to the image sensors 10, and a second region surrounding the first region. That is, the second region may be spaced apart from the image sensor 10, with the first region disposed therebetween. The first region may be a region through which a sawing blade does not pass during a die sawing process and may be a region for securing a margin of the die sawing process. The second region may be a region that is cut while a sawing blade passes therethrough during a die sawing process. That is, the sawing blade may separate the image sensors 10 from one another along the second region. The first region may be a residual scribe lane region RSL.

Barrier structures 430 may be disposed in the first region. The barrier structures 430 may surround the device region DR of the image sensor 10.

Figure 11A:
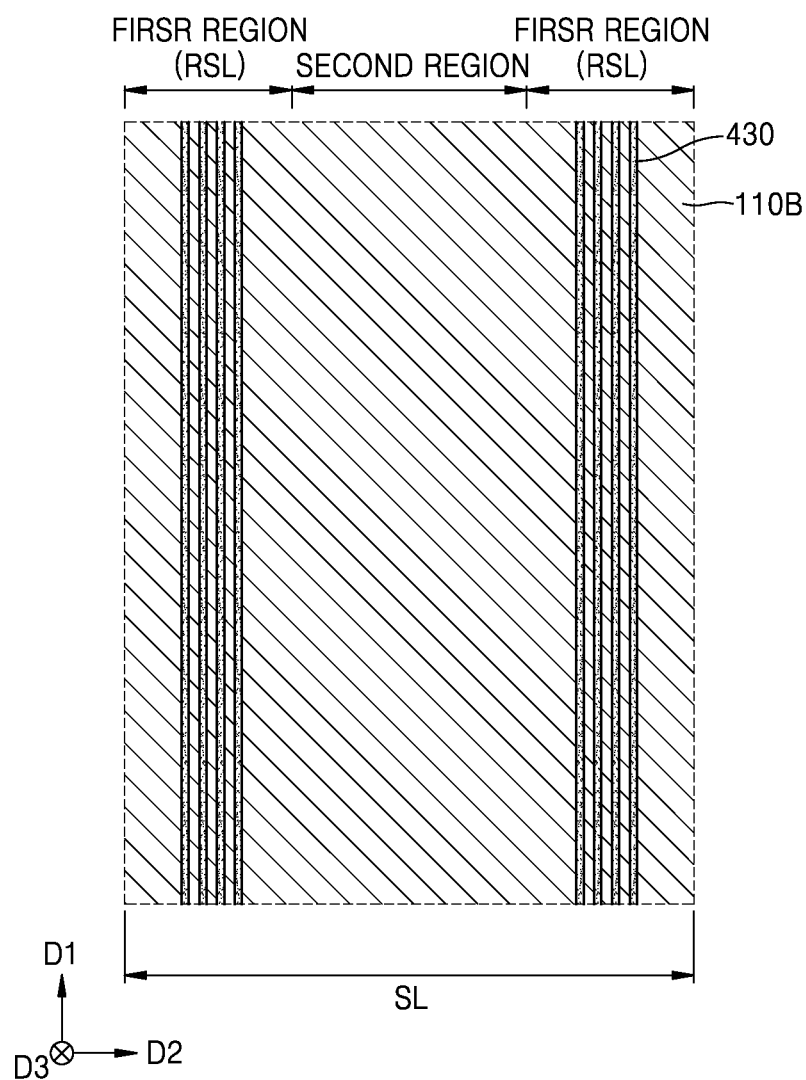
FIGS. 11A to 11D are plan views of scribe lane regions of a substrate including an image sensor, according to some example embodiments.

In some example embodiments, as illustrated in FIG. 11A, when viewed from above the second surface 110B of the substrate 110, the barrier structures 430 may be disposed in a shape of a plurality of line.

Figure 11B:
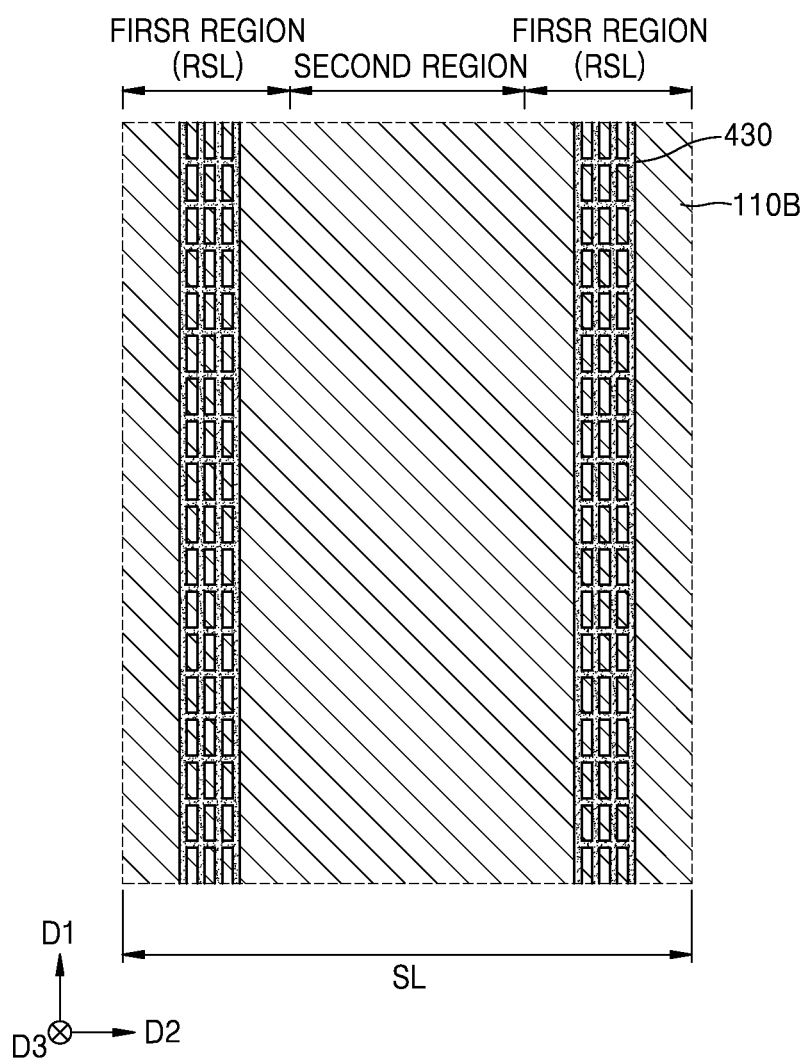

Alternatively, as illustrated in FIG. 11B, when viewed from above the second surface 110B of the substrate 110, the barrier structures 430 may be disposed in a grid shape.

Figure 11C:
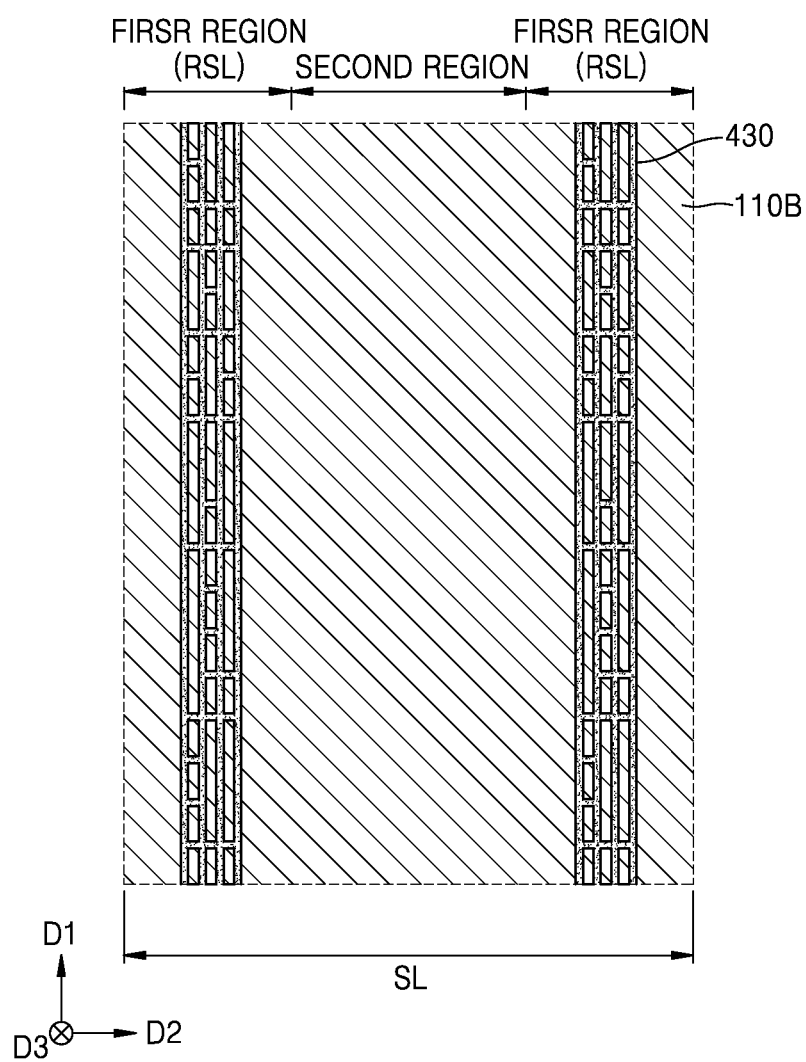

Alternatively, as illustrated in FIG. 11C, when viewed from above the second surface 110B of the substrate 110, the barrier structures 430 may be disposed in an irregular shape.

Figure 11D:
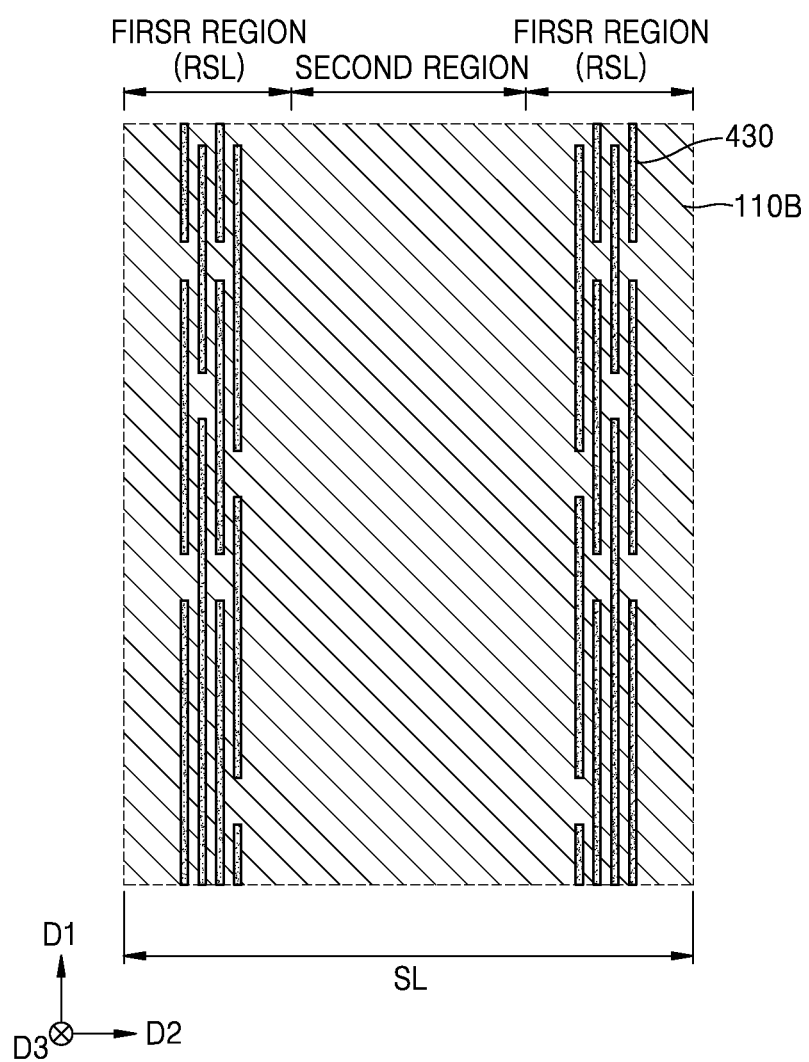

Alternatively, as illustrated in FIG. 11D, when viewed from above the second surface 110B of the substrate 110, the barrier structures 430 may be disposed in a shape of a plurality of discontinuous lines.

However, the barrier structures 430 are not limited to these shapes.

Figure 12:
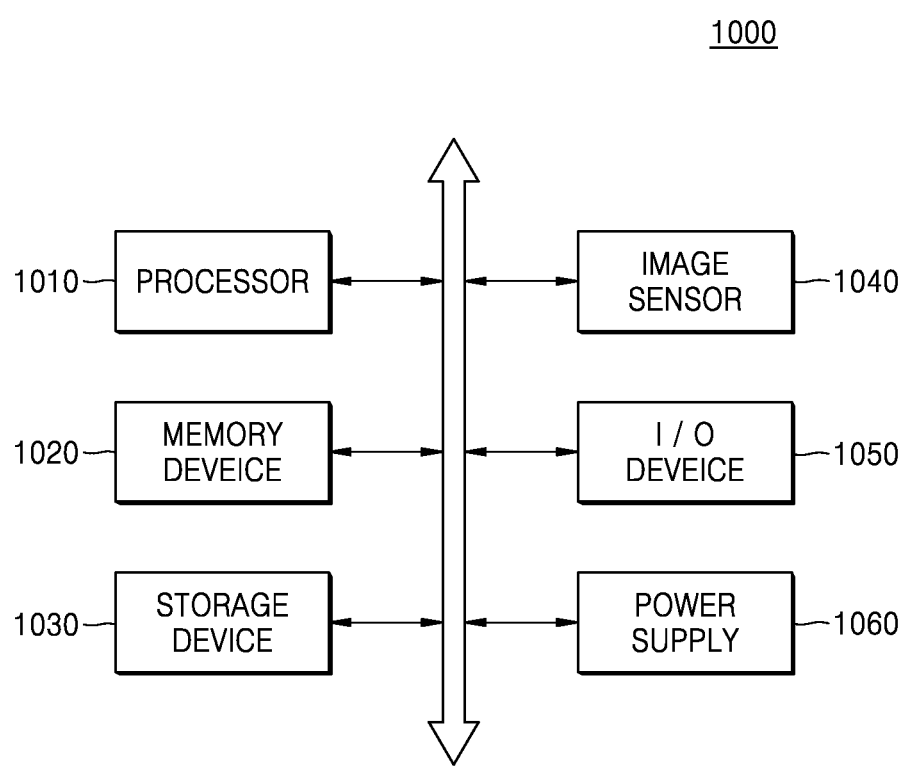
FIG. 12 is a block diagram of an electronic system including an image sensor, according to some example embodiments.

FIG. 12 is a block diagram of an electronic system 1000 according to some example embodiments.

Referring to FIG. 12, the electronic system 1000 may include a processor 1010, a memory device 1020, a storage device 1030, an image sensor 1040, an input/output (I/O) device 1050, and a power supply 1060. Although not illustrated, the electronic system 1000 may further include ports configured to communicate with a video card, a sound card, a memory card, a universal serial bus (USB) device, or other electronic systems.

The processor 1010 may execute specific calculations or tasks. For example, the processor 1010 may be a microprocessor or a central processing unit (CPU). The processor 1010 may connect to and communicate with the memory device 1020, the storage device 1030, and the I/O device 1050 through an address bus, a control bus, and a data bus. In some example embodiments, the processor 1010 may also connect to an extension bus such as a peripheral component interconnect (PCI) bus.

The memory device 1020 may store data necessary for operations of the electronic system 1000. The storage device 1030 may include a solid state drive (SSD), a hard disk drive (HDD), and a compact disk-read only memory (CD-ROM).

The I/O device 1050 may include an input device such as a keyboard, a keypad, or a mouse, and an output device such as a printer or a display. The power supply 1060 may supply operating voltages necessary for operations of the electronic system 1000.

The image sensor 1040 may connect to and communicate with the processor 1010 through the buses or other communication links. The image sensor 1040 may be substantially identical or similar to any one of the image sensors 10, 20, and 30 described above with reference to FIGS. 1 to 11D.

In some example embodiments, the image sensor 1040 and the processor 1010 may be integrated into one chip, or may be integrated into different chips.

Figure 13:
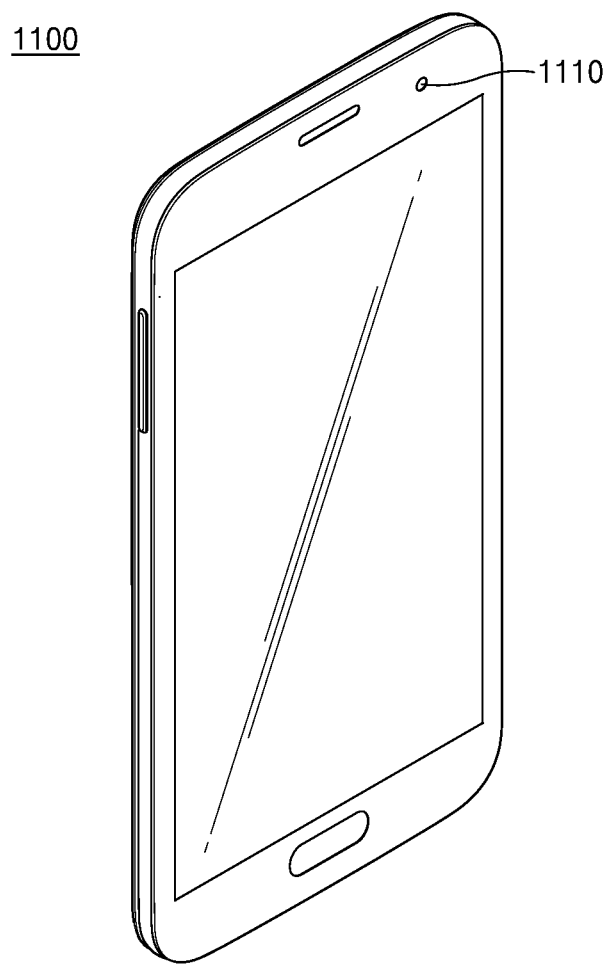
FIG. 13 is a perspective view of an electronic system including an image sensor, according to some example embodiments.

FIG. 13 is a block diagram of an electronic apparatus including an image sensor, according to some example embodiments.

Specifically, FIG. 13 illustrates a mobile phone 1100 including an image sensor 1110. The image sensor 1110 may be substantially identical or similar to any one of the image sensors 10, 20, and 30 described above with reference to FIGS. 1 to 11D.

At least one image sensor 1110 may be included in the mobile phone 1100. For example, one image sensor 1110 may be included in a front side of the mobile phone 1100, and another image sensor 1110 may be included in a rear side of the mobile phone 1100.

The image sensor 1110 may be applied to a smart phone, a personal digital assistant (PDA), a portable multimedia player (PMP), a handled gaming console, a portable computer, a web tablet, a wireless phone, a display device, or other image processors.

While some example embodiments of inventive concepts been particularly shown and described, it will be understood that various changes in form and details may be made therein without departing from the spirit and scope of the following claims.

What is claimed is:

1. An image sensor comprising:
a first substrate including a device region in which a plurality of unit pixels are disposed, a first residual scribe lane region surrounding the device region, and having a first surface and a second surface opposite the first surface;
a barrier structure penetrating the first residual scribe lane region of the first substrate;
a first structure including a first conductive film and a first insulating film, the first surface of the first substrate being on the first structure, a bottommost surface of the barrier structure being on top of a top surface of the first structure;
a second substrate including a second residual scribe lane region facing the first residual scribe lane region, and having a front surface and a rear surface; and
a second structure on the front surface of the second substrate, the second structure facing the first surface of the first substrate, the second structure being bonded to the first structure, and the second structure including a second conductive film and a second insulating film.

2. The image sensor of claim 1, wherein
the first substrate includes a device isolation structure between the plurality of unit pixels, a material in the barrier structure is the same as a material in the device isolation structure.

3. The image sensor of claim 2, wherein a level of the barrier structure is the same as a level of the device isolation structure in the first substrate.

4. The image sensor of claim 2, wherein the barrier structure and the device isolation structure are each a deep trench isolation (DTI).

5. The image sensor of claim 1, wherein a width of the barrier structure that is coplanar with the first surface of the first substrate is greater than a width of the barrier structure that is coplanar with the second surface of the first substrate.

6. The image sensor of claim 1, wherein
the first substrate includes a plurality of color filters at the second surface of the first substrate,
the first substrate includes a plurality of microlenses on the plurality of color filters, respectively.

7. The image sensor of claim 6, wherein the image sensor is a backside illumination image sensor.

8. The image sensor of claim 1, wherein an area of the first residual scribe lane region is substantially equal to an area of the second residual scribe lane region.

9. The image sensor of claim 1, wherein, when viewed from above the second surface of the first substrate, the barrier structure has a line shape.

10. The image sensor of claim 1, wherein, when viewed from above the second surface of the first substrate, the barrier structure has a grid shape.

11. The image sensor of claim 1, wherein, when viewed from above the second surface of the first substrate, the barrier structure has a discontinuous line shape.

12. The image sensor of claim 1, wherein the second substrate further comprises a device region in which a plurality of logic devices are disposed.

13. The image sensor of claim 1, wherein
the first substrate includes a via, and
the first conductive film and the second conductive film are electrically connected to each other through the via.

14. The image sensor of claim 13, wherein the via is a through silicon via (TSV).

15. The image sensor of claim 1, wherein
a bottom surface of the barrier structure is coplanar with the first surface of the first substrate.

16. An image sensor comprising:
a first substrate including a device region in which a plurality of unit pixels are disposed, a first residual scribe lane region surrounding the device region, and having a first surface and a second surface opposite the first surface;
a barrier structure penetrating the first residual scribe lane region of the first substrate;
a first structure including a first conductive film and a first insulating film, the first surface of the first substrate being on the first structure;
a second substrate including a second residual scribe lane region facing the first residual scribe lane region, and having a front surface and a rear surface; and
a second structure on the front surface of the second substrate, the second structure facing the first surface of the first substrate, the second structure being bonded to the first structure, and the second structure including a second conductive film and a second insulating film, wherein
a width of the barrier structure that is coplanar with the first surface of the first substrate is less than a width of the barrier structure that is coplanar with the second surface of the first substrate.

17. An image sensor comprising:
a first structure on a second structure,
the first structure including a first conductive film and a first insulating film,
the second structure including a second conductive film and a second insulating film; and
a first substrate on the first structure,
the first substrate including a first surface opposite a second surface,
the first substrate including a first residual scribe lane region surrounding a device region,
the device region including a plurality of unit pixels,
the first substrate including a barrier structure penetrating the first residual scribe lane region of the first substrate, wherein
the first substrate includes a device isolation structure between the plurality of unit pixels, and
a material in the barrier structure is the same as a material in the device isolation structure.

18. The image sensor of claim 17, wherein
the first conductive film in the first structure is not present below the barrier structure, and
the device region of the first substrate is positioned over the first conductive film of the first structure.

19. The image sensor of claim 17, wherein, when viewed from above the second surface of the first substrate, the barrier structure has one of a line shape, a grid shape, and a discontinuous line shape.

20. The image sensor of claim 17, wherein
the first substrate includes a via, and
the via electrically connects the first conductive film to the second conductive film.

* * * * *